United States Patent [19]

Hynecek

[11] Patent Number: 4,649,430
[45] Date of Patent: Mar. 10, 1987

[54] CCD IMAGER WITH MANY DUMMY PIXELS

[75] Inventor: Jaroslav Hynecek, Richardson, Tex.

[73] Assignee: Texas Instruments, Incorporated, Dallas, Tex.

[21] Appl. No.: 770,325

[22] Filed: Aug. 27, 1985

[51] Int. Cl.⁴ .......................... H04N 5/18; H04N 3/14
[52] U.S. Cl. ..................................... 358/213; 358/221
[58] Field of Search ........................ 358/213, 221, 212; 377/60

[56] References Cited

U.S. PATENT DOCUMENTS

| | | | |
|---|---|---|---|
| 4,237,383 | 12/1980 | Kosonocky et al. | 358/213 |
| 4,496,982 | 1/1985 | Levine | 358/213 |
| 4,498,105 | 2/1985 | Crawshaw | 358/213 |
| 4,513,313 | 4/1985 | Kinoshita et al. | 358/213 |
| 4,584,656 | 4/1986 | Sakai et al. | 358/213 |
| 4,587,563 | 5/1986 | Bendell et al. | 358/221 |
| 4,589,025 | 5/1986 | Monahan et al. | 358/221 |

*Primary Examiner*—Gene Z. Rubinson
*Assistant Examiner*—Stephen Brinich
*Attorney, Agent, or Firm*—Richard A. Bachand; N. Rhys Merrett; Melvin Sharp

[57] ABSTRACT

A CCD imager having one or more serial output shift registers 16, wherein the dark reference area 10 prime at the edge of the image area 10 is located so that it will be clocked into the opposite end 16 prime of the serial shift register 16 from the output amplifier 18. After a line of image information is clocked through the output amplifier 18, the dark reference information is left in dummy pixel area 16 double prime. At the next line transfer, the dark reference information stored in the portion 16 double prime is the first clocked into the output amplifier 18, and thus provides the reference information.

Standard TV formats have a limited amount of time available for horizontal blanking; this time limit, together with the CCD well clock rate, restricts the number of CCD wells which can separate the amplifier from the edge of the array. The present invention permits the amplifier to be located at a greater distance away from the array, because the clock cycles required for the dummy elements 16 double prime are used to load the dark reference information. This is particularly useful when the amplifier 18 is a correlated double sampling amplifier, or another amplifier which takes up a large amount of space.

8 Claims, 35 Drawing Figures

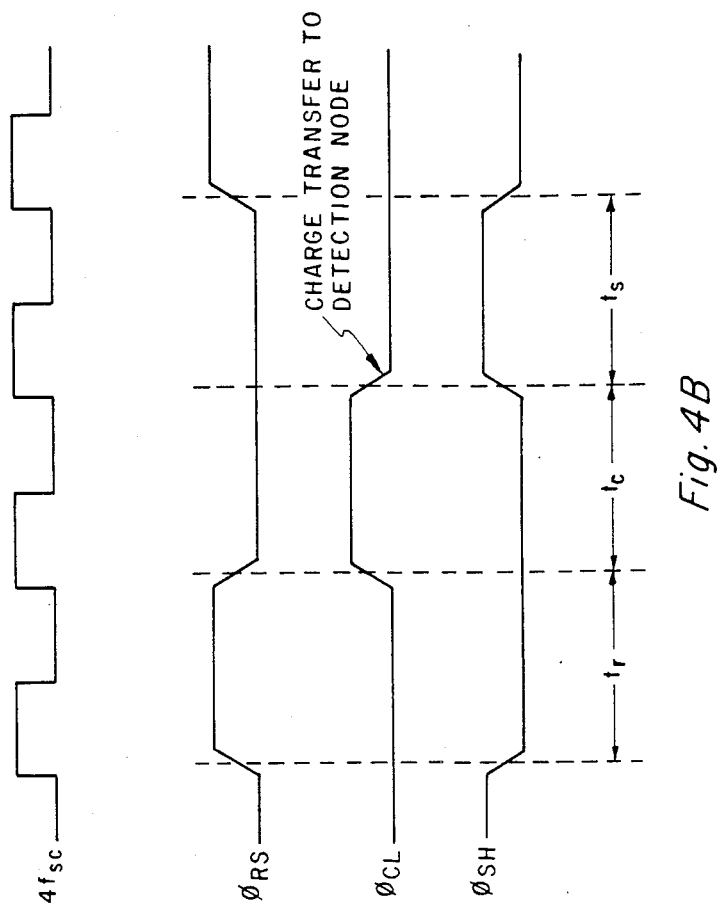
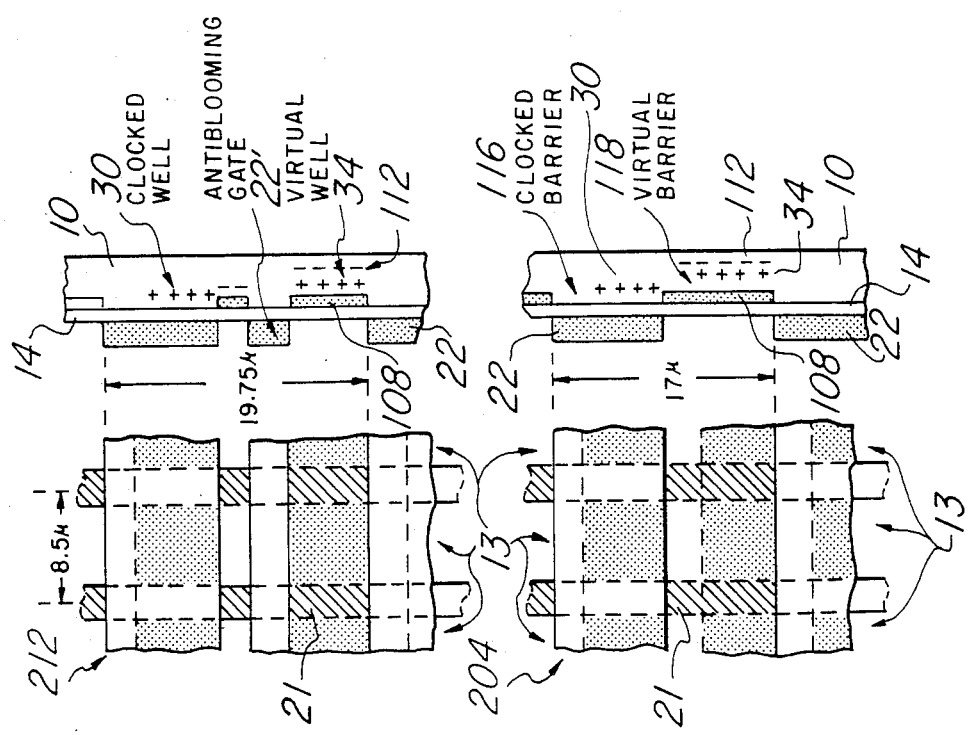

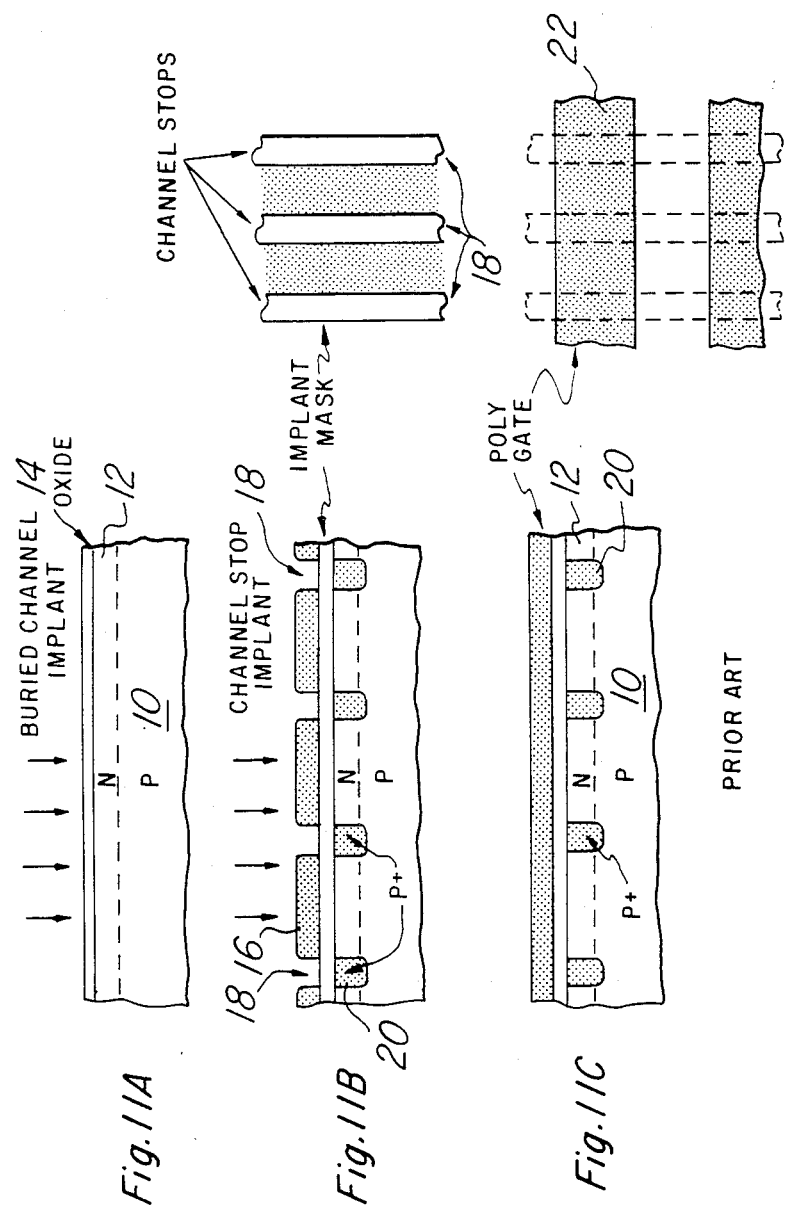

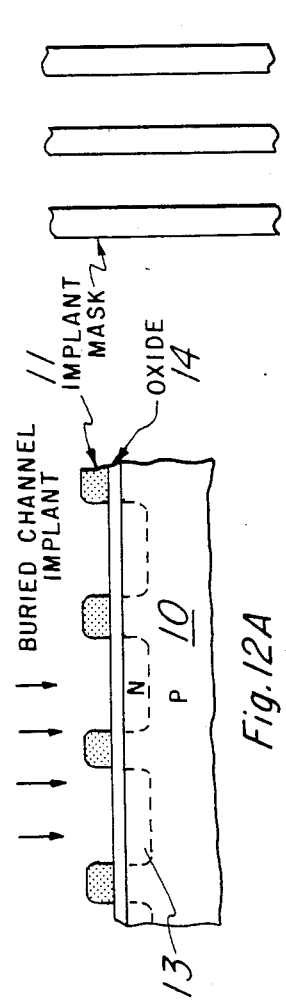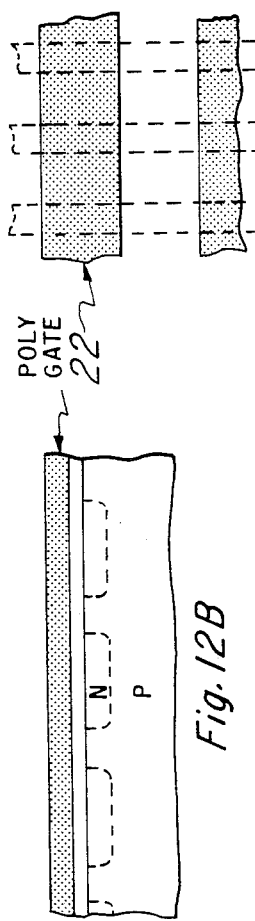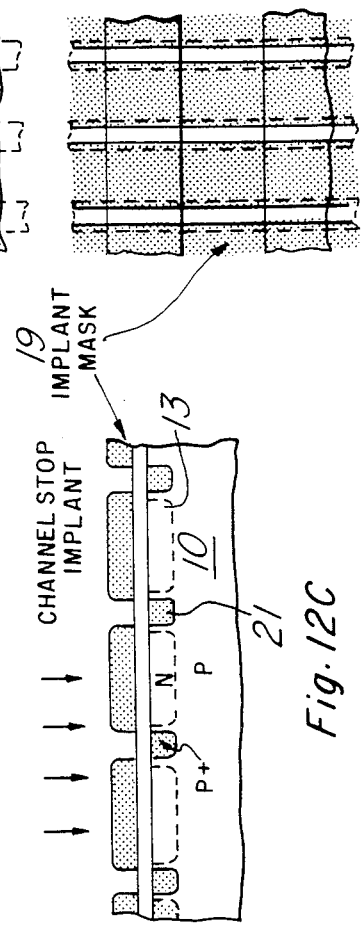

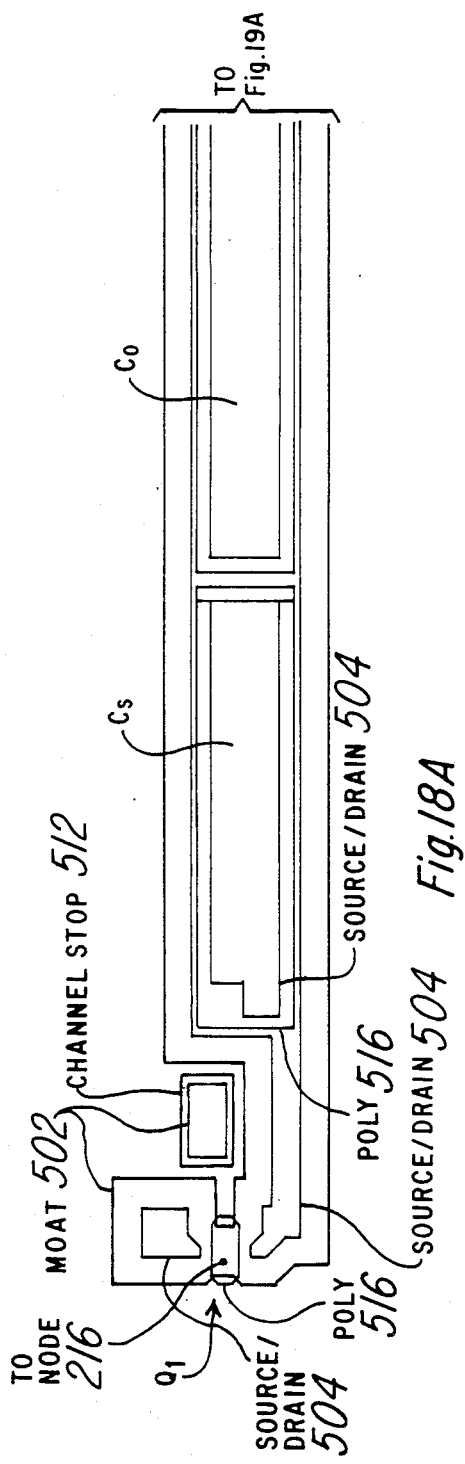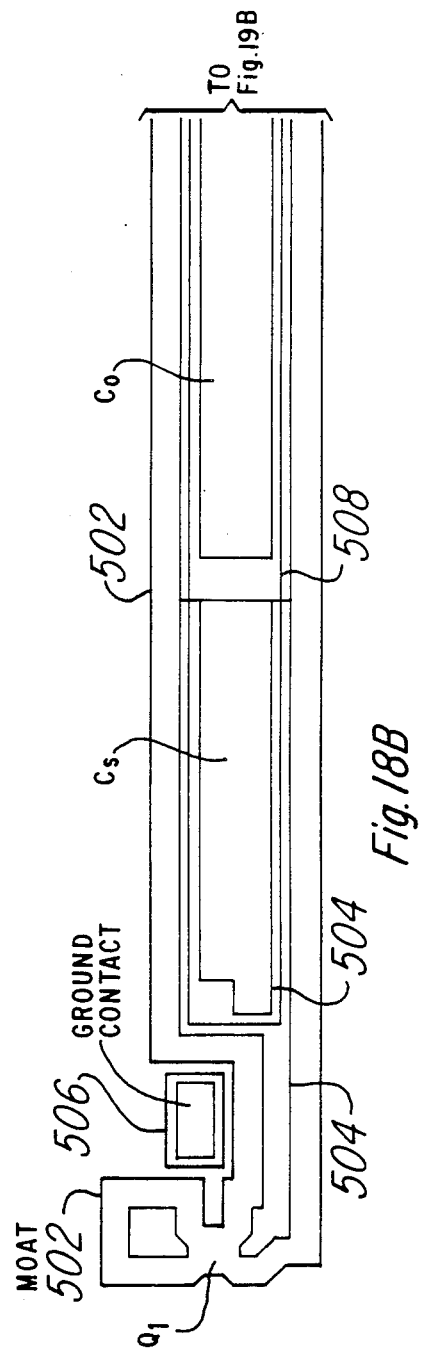

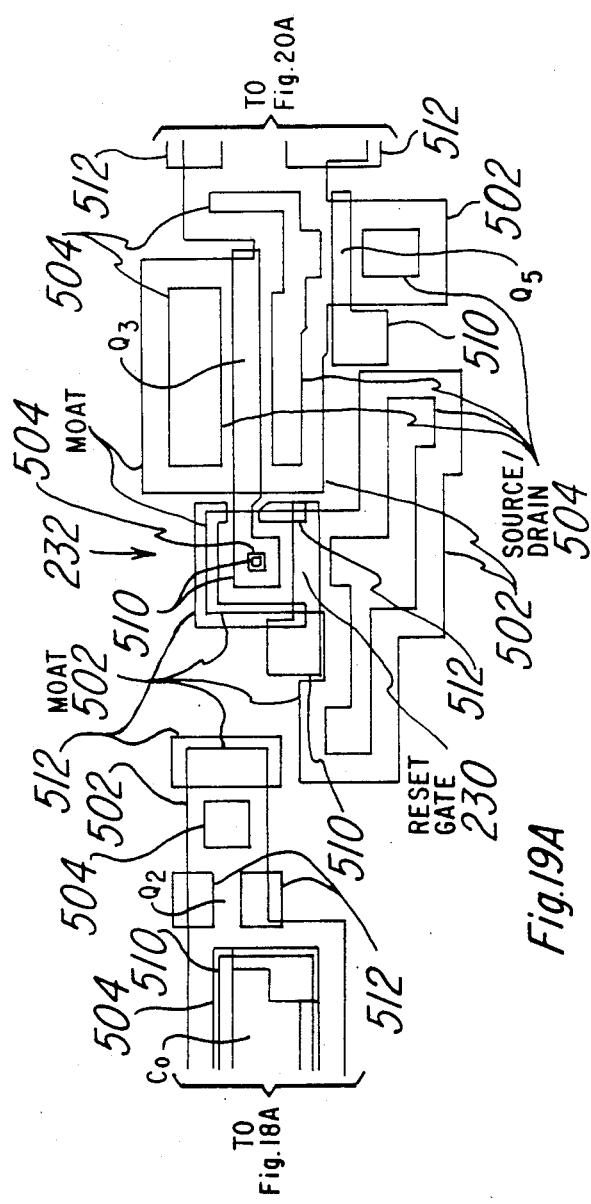
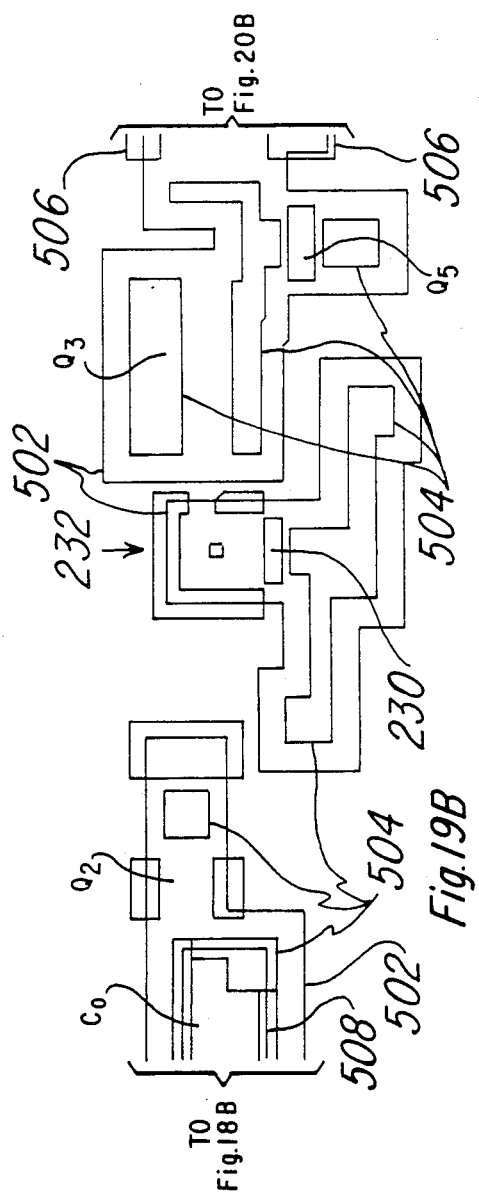
Fig.19A
Fig.19B

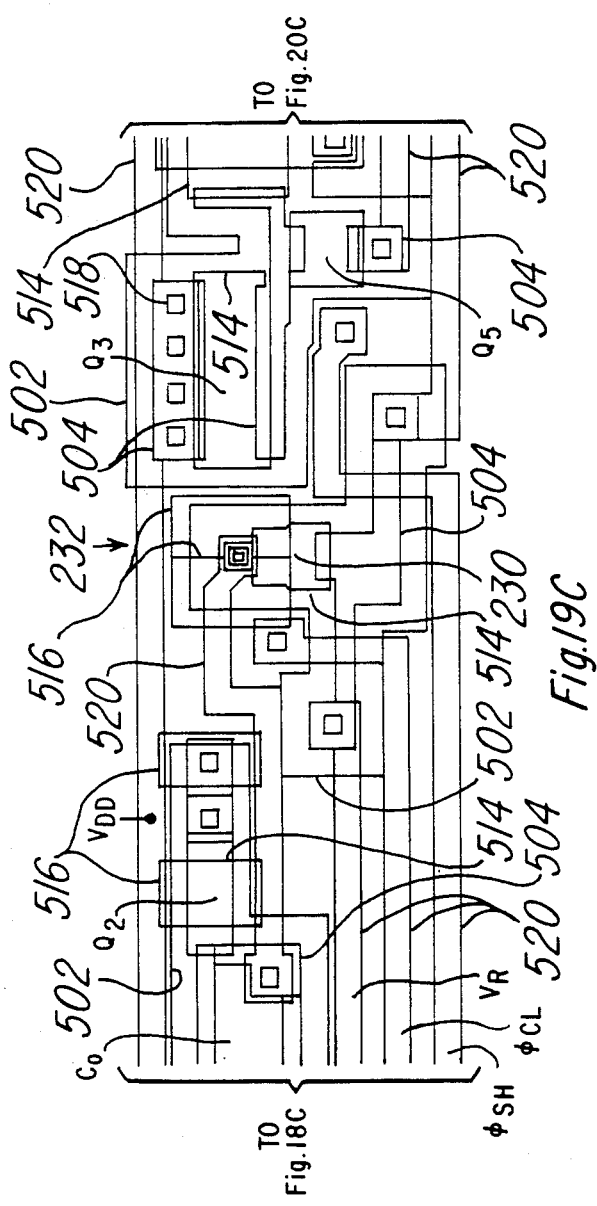
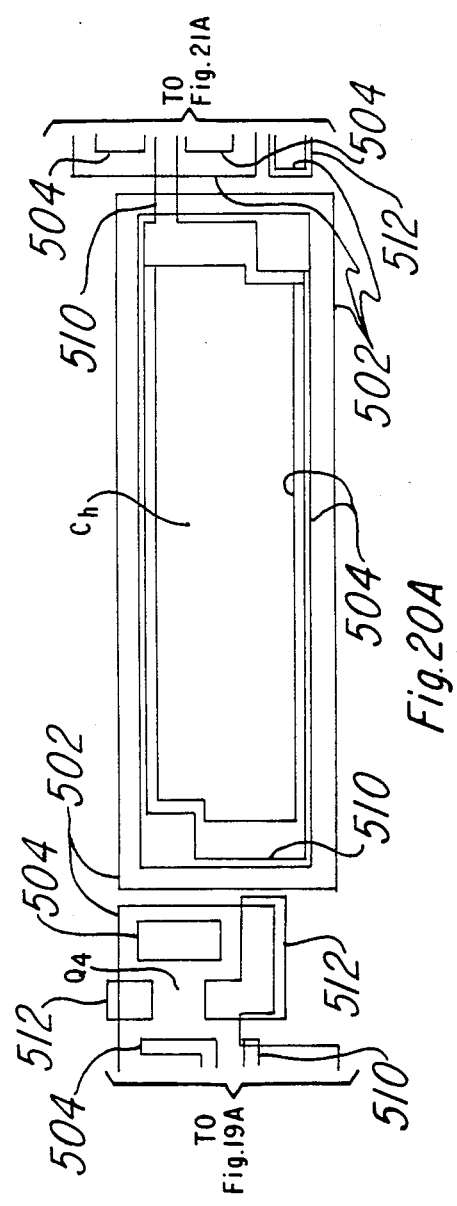
Fig.19C
Fig.20A

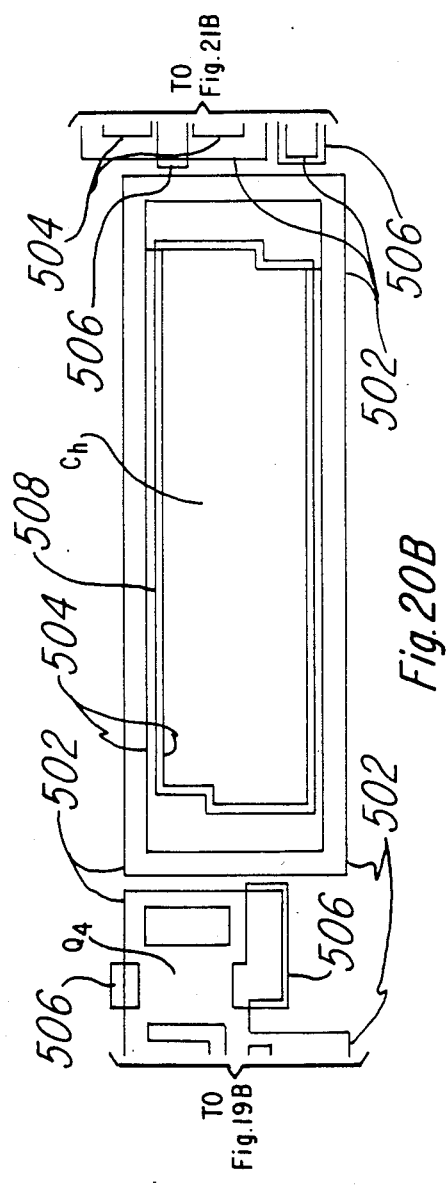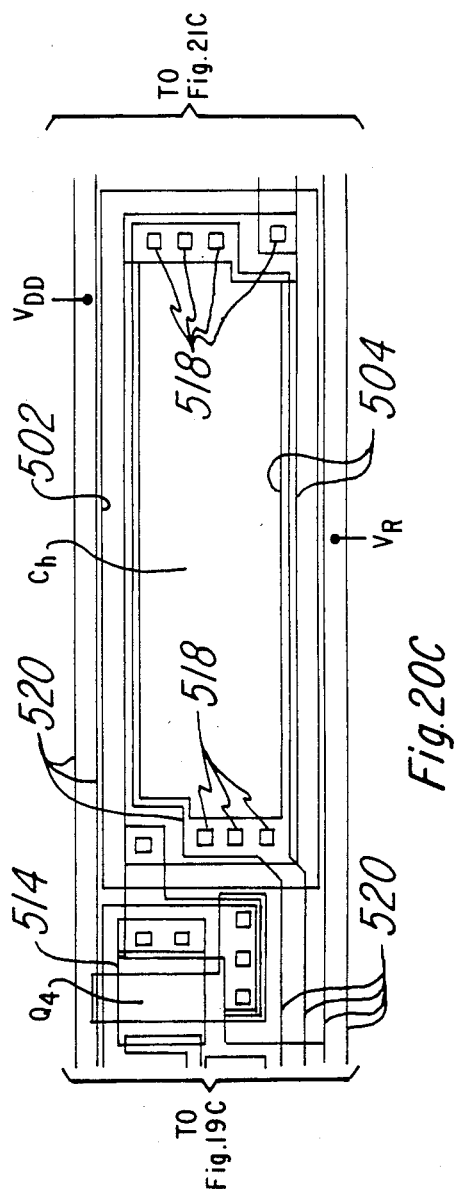

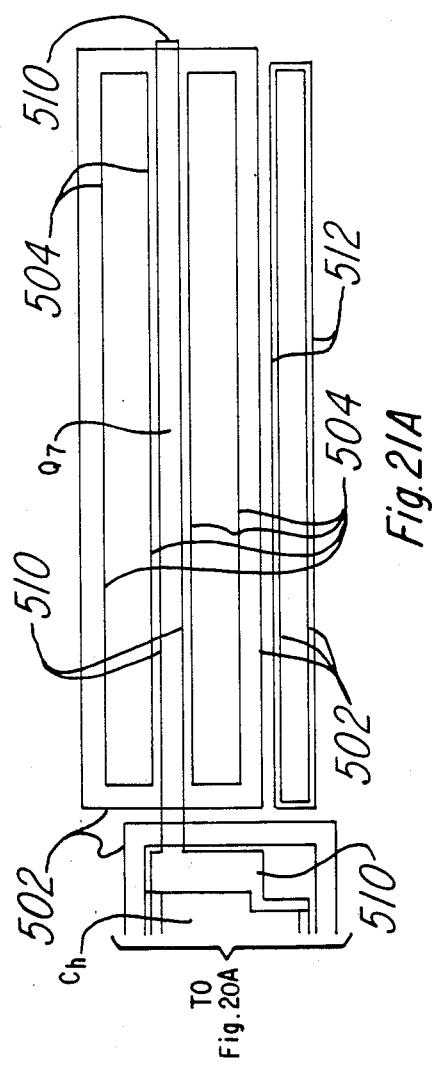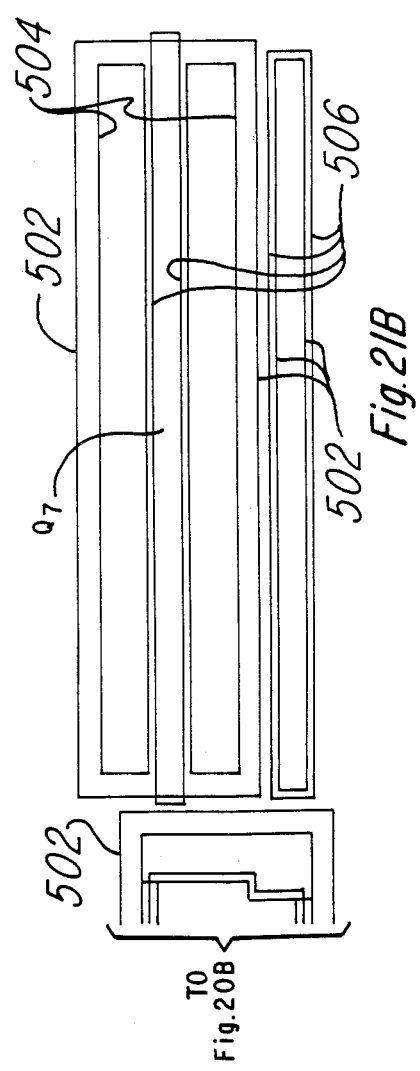

CCD IMAGER WITH MANY DUMMY PIXELS

CROSS-REFERENCE TO RELATED APPLICATIONS

The following patent applications of common assignee contain related subject matter, and all are hereby incorporated by reference:
Ser. No. 770,323 filed 8-27-85;
Ser. No. 770,111 filed 8-27-85;
Ser. No. 770,322 filed 8-27-85;
Ser. No. 770,112 filed 8-27-85;
Ser. No. 770,337 filed 8-27-85;
Ser. No. 770,326 filed 8-27-85.

BACKGROUND AND SUMMARY OF THE INVENTION

The present invention relates to area CCD imagers.

When CCD imagers are used with more than a minimal on-chip amplifier stage, the constraints of layout typically mean that the charge-sensing node in the amplifier cannot be located exactly at the edge of the array. Thus, a chain of CCD well (dummy pixels) is usually used to transfer the charge packets from the edge of the array to the charge-sensing node in the sense amplifier. However, if a relatively complex sense amplifier is used, such as a correlated double sampling or correlated clamp sample and hold amplifier, timing problems can occur with standard television formats.

That is, in normal CCD area imager architectures, one line of pixels at a time will be transferred in parallel from all the chains of CCD wells into one or more serial registers, and the serial registers will be checked to transfer this line of pixel information successively through a sense amplifier. For level setting, dark reference pixels (shielded from light by, e.g., a metal mask layer) are normally included at the edge of the imaging area. The charge packets from these dark reference locations are clocked through the sense amplifier first, to provide a reference level for subsequent processing stages to reference the image level to. This use of dark reference signals permits compensation for temperature variation, device parameter variations, etc. However, these practices lead to a timing constraint. In the prior art, after one line of charge packets is transferred into the serial register, the serial register must be clocked once for each of the dummy pixels, and then once for each of the dark reference pixels, before any of the charge packets from the imaging area begin to be clocked into the sense amplifier. Since the television format provides a constraint on the total time available per line, this number of CCD clock cycles, at the permissible clock rate for the device parameters used, may be too long. Since the only adjustable parameter in this timing constraint is the number of dummy pixels, this puts an effective limit on the number of dummy pixels which can be interposed between the edge of the array and the sense amplifier charge-sensing node. This in turn implies that it may not be possible to use the more complex amplifier designs, such as correlated double sampling or correlated clamp sample and hold, because their layout would require more dummy pixels between the edge of the array and the charge-sensing node than is permitted by the above time constraint.

This time constraint becomes even worse when more than one serial register is used for output. That is, for a color imager, it is preferable to include a multiplexing stage at the edge of the array, so that each set of three adjacent columns of the CCD array is multiplexed into a sequential output of three charge pockets, which can be transferred in parallel (across the width of the array) into three serial registers. Each serial register can then be clocked through its own sense amplifier, in parallel. However, the use of three sense amplifiers rather than one naturally means that the layout constraints which demand long dummy pixel chains become even worse. Moreover, the time required for the multiplexing gate to operate, and for the parallel transfer of charge packets into three serial registers rather than one, further detracts from the available time. This makes the time constraint even worse.

The present invention solves these problems, and permits use of complex sense amplifiers with multiple serial output registers, by locating the dark reference pixels at the opposite side of the imaging area from that normally used in the prior art. That is, in the prior art the dark reference pixel locations are normally located so that their signals will be clocked through the sense amplifier first, but, in the present invention, the dark reference pixels are located so that they are transferred into the serial register at the location farthest from the sense amplifier, rather than at the end closest to the sense amplifier as in the prior art.

In the present invention, after the charge packets from the imaging area have been clocked along the serial register and through the dummy pixels and into the sense amplifier, the charge packets from the dark reference pixels are not immediately clocked through the sense amplifier, but are left in the dummy pixels during the next parallel transfer of charge packets into the serial register. When the next line of charge packets is clocked through the sense amplifier, the dark reference pixels from the previous line are already stored in the dummy pixels, and waiting to be clocked through the sense amplifier. Thus, the delay component which was due to the number of dummy pixels has been reduced by the number of dark reference pixels which would otherwise be used.

Thus, this area CCD imaging architecture advantageously provides a CCD imager which can operate at standard television timing specifications and still use a complex sense amplifier.

The present invention also advantageously provides a CCD area imager which can operate at standard television timing specifications and also use three separate complex sensing amplifiers.

According to the present invention there is provided: An imager comprising: an image area comprising a plurality of columns of CCD elements, said image area also comprising a dark reference area comprising a further plurality of columns of CCD elements shielded from exposure to light; a storage area, comprising a plurality of columns of CCD elements shielded from exposure to light, and further comprising: a serial shift register, comprising means for receiving packets of charge from respective ones of said columns of CCD elements in said storage area; and an amplifier connected to said serial register at the opposite end from the portion of said serial register which initially receives charge packets generated in said dark reference area from said storage area.

BRIEF DESCRIPTION OF THE DRAWING

The present invention will be described with reference to the accompanying drawings, wherein:

FIG. 4b shows the clock phases phi-rs, phi-cl, and phi-sh used both to control the amplifier shown in FIG. 4a and also to clock the serial transfer gates 22s3, 22s2, and 22s1 of shift registers 206. The frequency 4f(sc) shown at the top is the subcarrier frequency (which in this embodiment is four-thirds times the transfer frequency used in CCD chains), and is provided merely as a reference.

FIG. 6 shows plan and section view of CCD cells in the image aerea 212 (the top portion of the figure) and storage area 204 (the bottom portion of the figure) for one sample embodiment, namely a 488V X 774H frame transfer VPCCD image sensor with 8 MM image sensing area diagonal.

FIG. 9 shows a cross section of a sample structure for the detection node 216 preferably used in the amplifier of FIG. 4a.

FIGS. 11a–11c show an example of a prior art method of making a CCD, in which the channel stops extend uniformly under the clocked and virtual gates.

FIGS. 12a–12c show key steps in a novel method of making a CCD, using a two-mask channel definition process.

FIGS. 18A, 18B, 18C, 19A, 19B, 19C, 20A, 20B, 20C, 21A, 21B, and 21C show the presently preferred layout of critical portions of the amplifier. These figures are overlays showing the mask layout: FIGS. 18A, 19A, 20A, and 21A show the moat 502, source/drain 504, poly 510, and the patterned channel stop 512 levels; FIGS. 18B, 19B, 20B, and 21B show the moat 502, source/drain 504, patterned channel implant 506 (which is performed before the patterned channel stop implant 512), and As-well (clocked well) 508 levels; FIGS. 18C, 19C, 20C, and 21C show the moat 502, source/drain 504, virtual well 514, virtual phase electrode (boron) 516, contacts 518, and metal 520 levels. These figures all adjoin each other; left to right, the order is FIG. 18, FIG. 19, FIG. 20, and FIG. 21.

DESCRIPTION OF THE PREFERRED EMBODIMENTS

Figure 1:
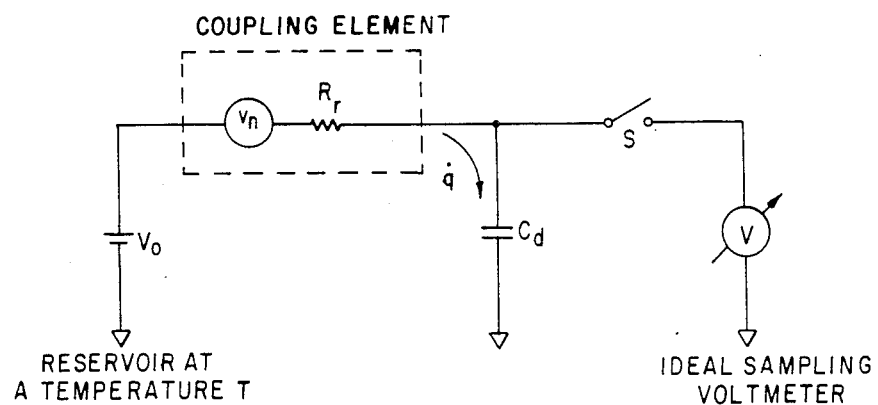
FIG. 1 shows a circuit diagram of the thermodynamical system in equilibrium with a simple resistor as a coupling element, where the voltage on the capacitor is periodically sampled.

The process preferably used in manufacturing devices in accordance with various of the points of novelty taught by the present application will first be described in detail.

Processing

FIG. 11 shows an example of a prior art method of making a CCD. A p-type substrate 10 has an oxide 14 grown on it, and then a blanket buried channel implant forms a surface layer 12 which is n-type. (Alternatively, the surface layer 12 may be grown epitaxially instead of implanted.) An implant mask 16 is patterned to expose channel stop locations 18. P-type implantation then results in the formation of p+ channel stops 20, as shown in FIG. 11b. Finally, clocked wells are implanted, and the poly gate 22 is patterned across the lines of channel stops. The patterning of the poly gate 22 defines the location of the clocked phases along the channels.

In the present invention, an extra mask step is added, and the order of the steps is changed, to produce substantial advantages. Key steps in the process of the present invention are shown in FIG. 12. The first difference, as shown in FIG. 12a, is that the buried channel implant is patterned by an implant mask 11, to produce patterned channels 13 as opposed to the blanket layer 12 using the prior art. Then (after the clocked wells have been formed), the poly gate 22 is patterned, as shown in FIG. 12b. Next, a channel stop implant is screened by an implant mask 19, to produce patterned p+ channel stop regions 21 as shown in FIG. 12c.

Thus, since the channel stop implant is applied after the poly gate 22 has been patterned, the p+ channel stops 21 do not extend continuously along the full region of the channel, but are interrupted every time they are intersected by a portion of a poly gate level 22. This means that the width of the channel diffusion 13 under the poly gate 22 is increased, since there is no p+ region 21 to outdiffuse in these regions. This means that the capacity of the clocked well is increased.

To correspondingly increase the capacity of the virtual phase well, one additional (Hi-C) implant is preferably performed. This is a deep p-type implant, with a stopping distance near or below the bottom junction location which will be defined by the doping profile of the buried channel locations 13. Thus, the capacity of both virtual phase and clocked phase is increased.

The foregoing description summarizes a few of the key features which distinguish the present invention from the prior art. The fabrication process will now be discussed in great detail, with primary reference to the CCD array. Additional masks and fabrication steps may be used for fabrication of the periphery, including some which are entirely conventional in NMOS logic and will not be discussed in any great detail. Also, many minor processing steps (such as cleanups, growth of anti-Kooi-effect oxide, stripping of masks, etc.) are omitted, because they are very widely known and their insertion at appropriate points is totally obvious to anyone skilled in the art.

It should also be noted that the following description gives many specific implant dose and energy specifications. These are illustrative only, provided to better permit one skilled in the art of fabricating semiconductor devices to make and use the various inventions disclosed, and do NOT limit the scope of the invention. In particular, the currently preferred ranges for dose and energy are given; but, as is well known to processing engineers, such specifications may be very widely varied. Many of the parameters given may be varied by plus or minus 50% OR MORE, depending on the tradeoffs exploited by the process engineer. As is well known, there are innumerable tradeoffs between the parameters of any one implant step and oxide thicknesses, supply voltage, annealing conditions, the parameters of other implant steps, etc. Moreover, many substitutions of technologies can be made (to name only one example, sidewall masked isolation could be used instead of LOCOS), and steps can be interchanged and modified as well.

Many parts of the specification of the present patent application have particular reference to a process which uses virtual phase CCD technology. Background on virtual phase CCD technology can be found in the following articles, all of which are hereby incorporated by reference: Hynecek, "Virtual Phase Technology: a New Approach to Fabrication of Large-area CCDs," 28 IEEE Transactions on Electron Devices 483 (1981); Hynecek, "Electron-Hole Recombination Antiblooming for Virtual-Phase CCD Imager," 30 IEEE Transactions on Electron Devices 941 (1983); Hynecek, "Design and Performance of a Low Noise Charge Detection Amplifier for VPCCD Devices," 31 IEEE Transactions on Electron Devices 1713 (1984); Hynecek, "Design and Performance of a High-resolution Image Sensor for Color TV Applications," forthcoming in the August 1985 issue of IEEE Transactions on Electron Devices; and U.S. Pat. No. 4,229,782, which is also hereby incorporated by reference.

However, many of the innovations described are perfectly applicable to other CCD technologies as well. Virtual phase technology is referred to so extensively merely because (1) it represents the currently contemplated best mode of using the various inventions described, and (2) it is often more advantageous to apply various innovations described here in the context of virtual phase technology than it would be in the context of other CCD technologies—i.e. the innovations are applicable and advantageous in many other technologies, they are simply more advantageous in virtual phase technology.

The processing sequence preferably used will now be described in great detail.

A substrate having a monocrystalline semiconductor upper portion, for example a p-on-p+ silicon wafer having a 10 micron thick epitaxial layer doped to around 1E15 per cm cubed p-type, is provided as starting material.

The first masking step used is a moat masking step. This is used, as is conventional, to pattern a silicon nitride masking layer; the openings in the nitride layer expose selected regions to a LOCOS-channel-stop implant (e.g. 1E14 (this notation is conventionally used for "one times ten to the fourteenth power") per cm squared of boron at 60 keV) and then to a long oxidation, in order to form LOCOS isolation surrounding moat regions (moat regions are the regions where active devices are to be formed) in the periphery. Since no oxide isolation is needed in the CCD array, the whole array is masked from the field oxidation steps.

Next, a source/drain mask is used to mask off the entire CCD array (except for diode locations, such as the clearing diodes along the top and bottom edges of the array), so that an n+ source/drain implant can be used to form NMOS devices in the periphery. This implant may be, for example, 3E15–7E15 per cm squared of phosphorus at 30–60 keV. Note that this is not a self-aligned source-drain implant, as used in most MOS processes: the virtual well implant will later be used to form source/drain extensions (LDD regions) which are self-aligned to the poly gate level. (This mask is also used to mask a plasma etch which strips the LOCOS nitride from exposed portions of the moat (in the periphery) and from the exposed portios of the CCD array. The portion of the LOCOS nitride under this mask can be removed by wet etching later.) The use of a masked source/drain implant not only provides low-resistance diffused interconnects and LDD structures (which reduce hot-electron problems), but also is advantageous if JFET devices are used in the periphery: the masked source/drain implant means that the JFET channel regions can be screened from this implant. Instead of implanting, this step of introducing dopants may be performed as a POCl/3-deposition step instead.

Next, implant mask 11 is patterned to expose the CCD channel regions, and an implant of 1E12–2E12 per square centimeter of phosphorus at 100–150 keV is applied to form buried channel regions 13, as shown in FIG. 12a.

Next an arsenic implant of 2E14–4E14 per square centimeter at 20–30 keV is applied to form clocked wells.

Figure 16:
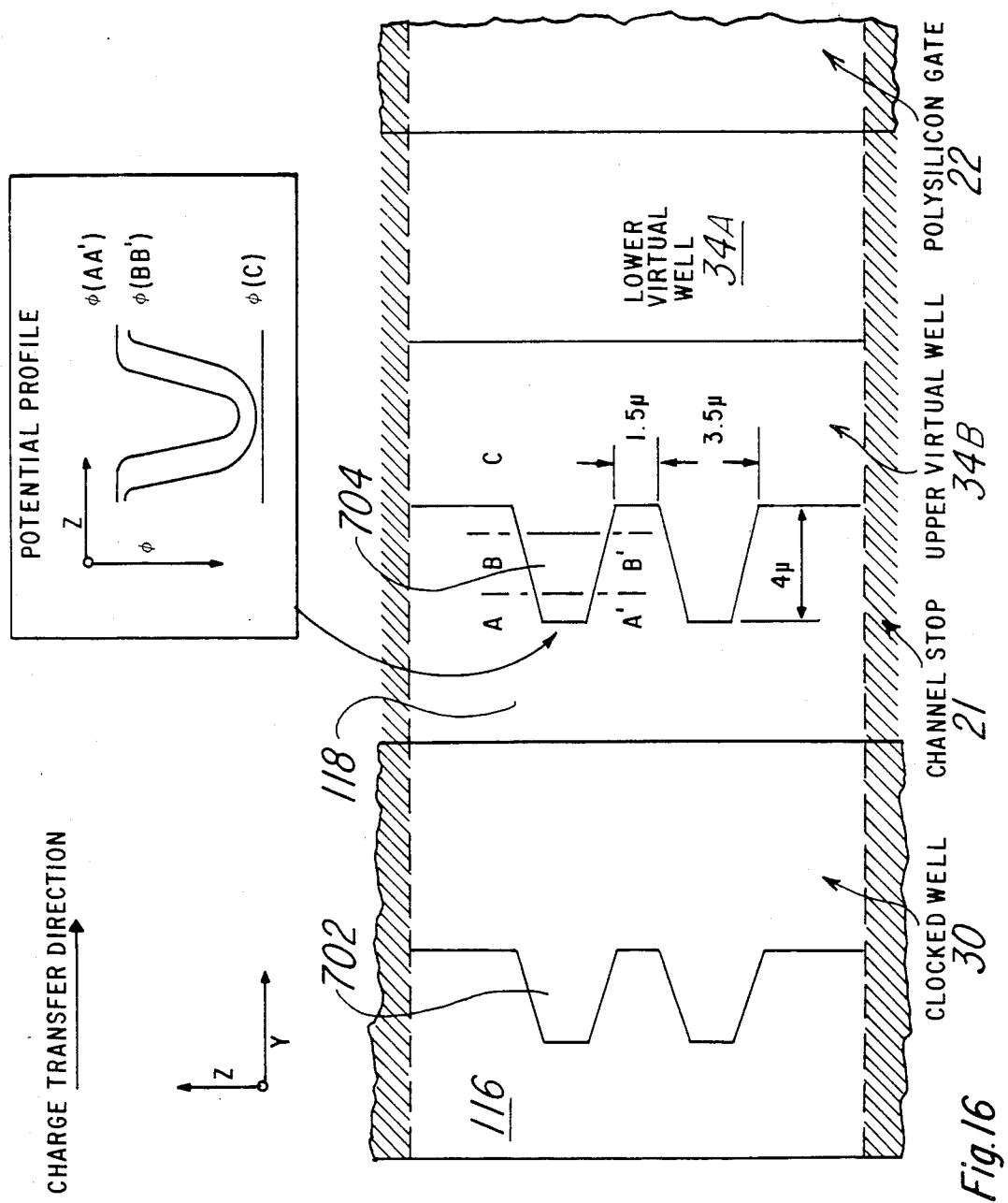
FIG. 16 shows a plan view of the implant masking used, in an alternative class of embodiments which is particularly attractive where pixel spacing is more than 20 microns, to achieve a graded profile of the potential energy for electrons within each CCD pixel, to promote higher charge transfer efficiency.
Figure 17:
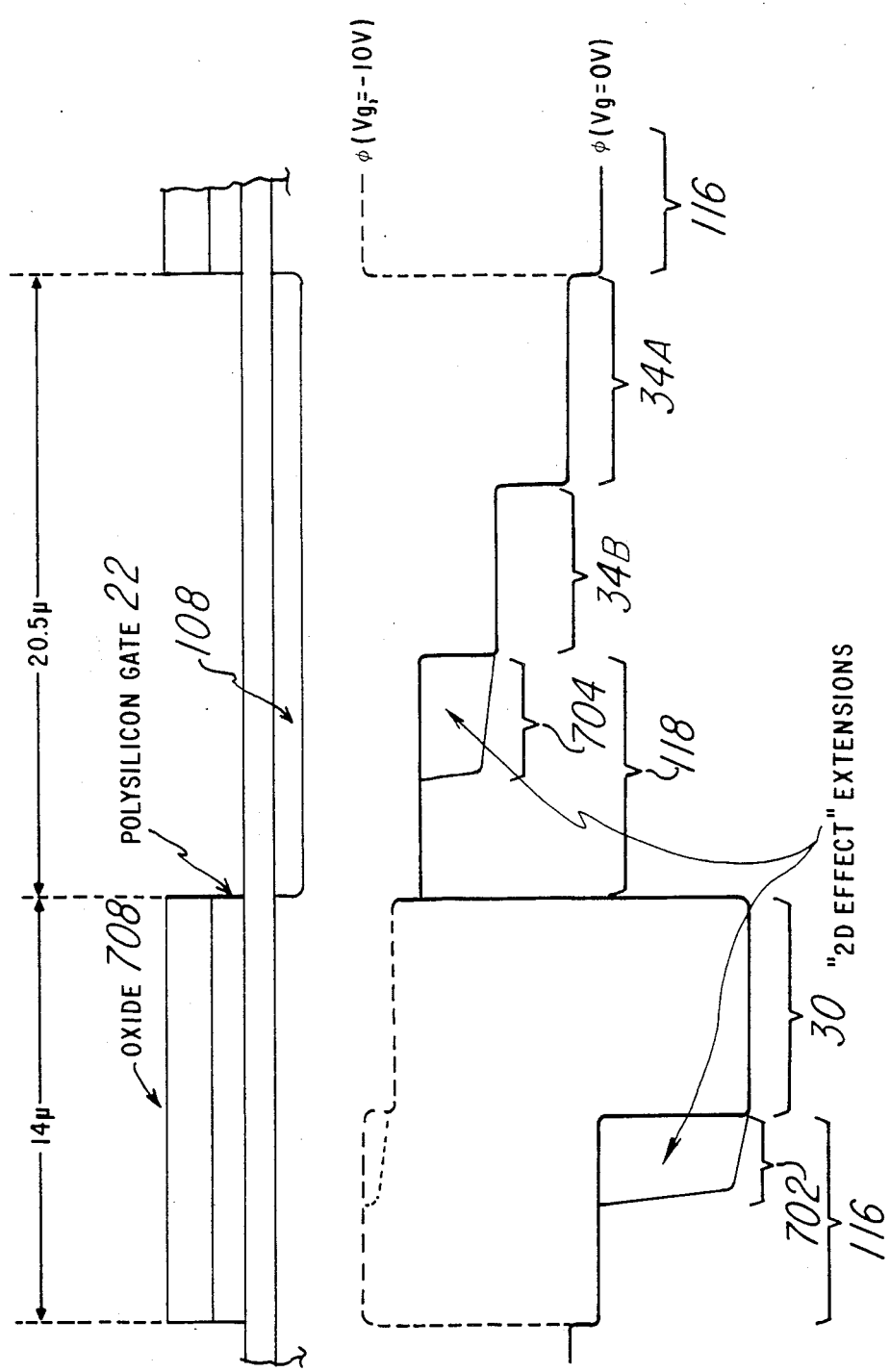
FIG. 17 shows an example of the potential energy profiles which are achieved by this structure.
Figure 18C:
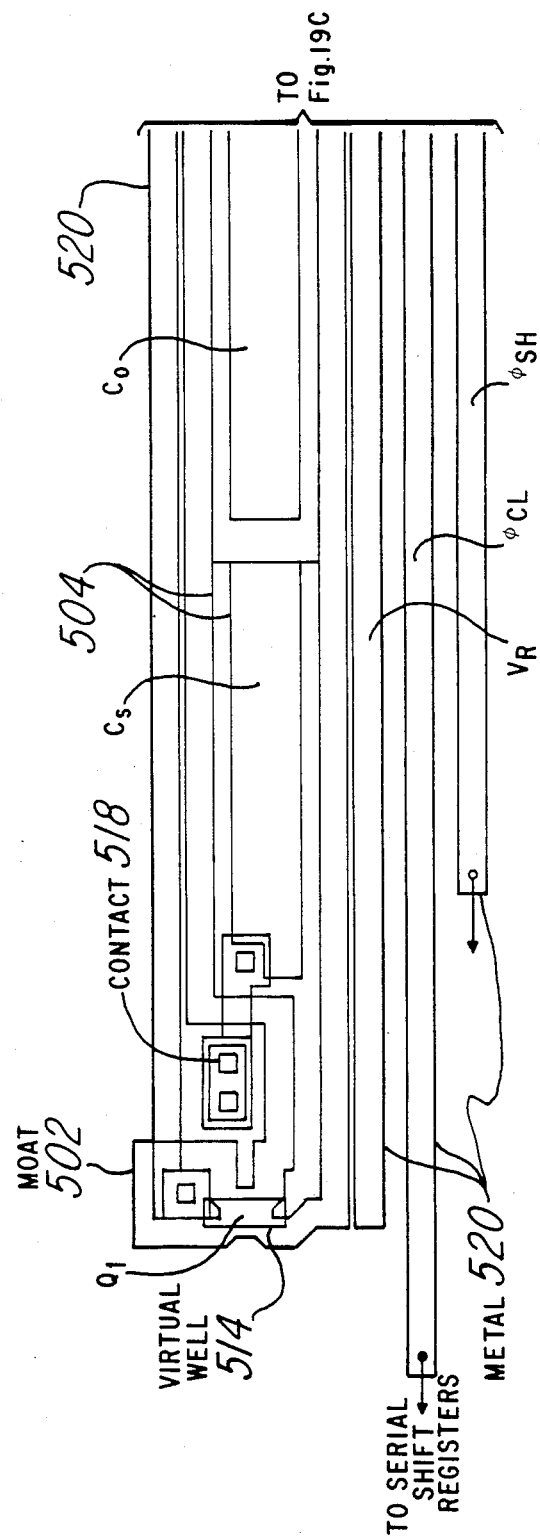
Figure 21C:
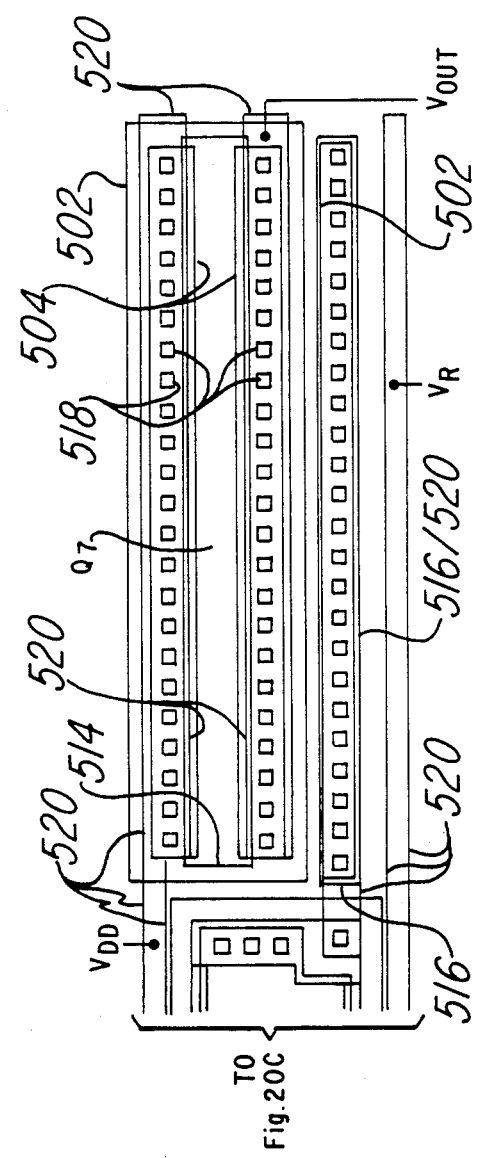

An alternative class of embodiments can be provided by a modification to this step of the process. FIG. 16 shows a plan view of the wedge-shaped extensions 702 which can be used with the clocked well masking. This alternative class of embodiments is particularly attractive where pixel spacing is more than 20 microns, to achieve a graded profile of the potential energy for electrons within each CCD pixel; such a graded profile promotes higher charge transfer efficiency in large devices. FIG. 17 shows an example of the potential energy profiles which are achieved by this structure.

That is, in large dimension CCDs, the transport of carriers within a large well region will be limited by carrier diffusion statistics except where the carriers are close to the potential gradient at the boundary between the well and the barrier of the succeeding phase. This carrier diffusion process imposes a trade-off between clock frequency and charge transfer efficiency, but it is highly undesirable (particularly in a frame transfer device) to have to make any compromise in either of these parameters. Thus, it has been recognized as desirable, in the prior art, to introduce some potential energy gradation within the wells, to accelerate complete transfer of the carriers to the well boundary when the barrier of the adjacent phase is brought to a lower potential energy.

This can be a problem in the array of large CCDs, but it can also be a particular problem in the multiplexing and serial register portions of CCDs as small as (for example) an 11 mm diagonal (488 by 780 pixels) device with three serial registers, where the pitch of each serial register corresponds to three times the horizontal pitch of the array.

Prior art methods of accomplishing this have used multiple implants, but of course each extra implant requires an extra mask level, so that this has been tremendously expensive in terms of processing complexity. A novel way to accomplish this is by the use of two-dimensional potential effects; such effects are known, but the application of them to achieve potential gradation within a single well region in a CCD is believed to be novel. That is, among the novel teachings in this application is that potential gradients within a well can be achieved merely by geometrical modifications to the mask geometries of the patterned implants which already require masking steps, without any requirement for use of additional masking steps.

In the embodiment shown in FIG. 16, the shape of clocked well 30 is modified to include wedge-shaped extensions 702. The virtual well region 34 shown in FIG. 6 is split, in the embodiment of FIG. 16, into two portions, an upper virtual well 34B and a lower virtual well 34A, where the upper virtual well 34B has a potential energy intermediate between that of the lower virtual well 34A and that of the virtual barrier 118. (One extra mask is required to accomplish this.) Moreover, the upper virtual well 34B is patterned to include wedge-shaped extensions 704 protruding into the virtual barrier 118, and the potential profiles at the top of FIG. 16 show the lateral variation in potential across these wedges along the marked sections A through C. That is, the device structure shown effectively provides two regions of intermediate potential in the virtual phase: one is the "upper virtual well" 34B, which provided in the conventional way at the cost of a mask; but the other is provided by the wedge-shaped extensions, which effectively provide an additional intermediate potential region without requiring an additional masking step. The "upper virtual well" 34B can alternatively be thought of as a lower barrier region, since any charge transferred into upper virtual well 34B will all be collected in the lower virtual well 34A anyway.

FIG. 17 shows potential profiles for the regions of FIG. 16. Note that the potential profiles for the clocked portions 116, 702, and 30 are shown for both states of the polysilicon clocked electrode 22.

However, the embodiment of FIG. 17 and FIG. 16 is not the principal preferred embodiment, and discussion of the principal preferred embodiment will now resume.

Next, gate oxide 14 is grown on all exposed areas of silicon, to a thickness of, for example, 700 A, and poly gate 22 is patterned.

Next, a channel step implant mask 19 is used to expose channel stop regions 21 to a p-type implant, for example 1E13-5E13 per centimeter squared of boron at 100-200 keV.

Next, a virtual well implant, for example 1.3E12 per centimeter squared of phosphorus at 200 keV, is performed into areas 34. As discussed above, if it is necessary to create potential gradients within some or all of the virtual wells, the mask for this implant step may be modified to include wedge-shaped extensions, and the mask itself may be split, i.e. an additional mask level may be used to separately pattern both an upper virtual well and a lower virtual well. However, use of this additional mask is not presently preferred.

Next, a blanket virtual barrier implant, for example 1.4E12 per square centimeter of phosphorus at 300 keV, is preferably performed overall.

The virtual well, virtual barrier, and channel stop implants can be performed in any order. However, one useful and novel teaching of the present application is that the channel stop implant should be patterned after the poly gate 22 has been patterned.

Next, a deep p-type implant, for example 2E12 per square centimeter of boron at 200 keV or more, is preferably performed. This implant functions as a "Hi-C" implant to increase the capacity of the virtual well locations. This implant is not masked in the array, but may be masked in the periphery to provide control over the turnoff characteristics of the JFET devices and avoid degrading the diode breakdown of the n+ source/drain diffusions.

It is preferable that the gate level 22 be thick enough to stop this implant and the channel stop implant. However, stopping boron at more than 100 keV requires a significant thickness of polysilicon, and this conflicts with another goal: to boost quantum efficiency, it is desirable to have the polysilicon gate 22 thin enough to be partially transparent, so that at least some photocarriers can be collected in the clocked wells (in addition to the virtual wells) during the frame exposure period of the imaging array. This will not be practical unless the gate 22 is reasonably thin, e.g. half a micron or less.

To avoid this dilemma, a further novel teaching of this application is that the gate structure should include a thick transparent oxide 708 overlying the polysilicon 22. This layered structure is patterned by conventional stack-etching methods. For example, the gate may be polysilicon 2000-3000 A thick and doped to a sheet resistance of around 20 to 100 ohms per square, and the transparent oxide 708 may be CVD or plasma oxide, and be at least 2000-5000 Angstroms thick. In future embodiments it may be desirable to scale the poly layer 22 down to 500 A thick. Reducing the thickness of the poly increases its transparency and assists in collecting photocarriers in the clocked wells during the exposure interval, thereby raising the quantum efficiency.

Figures 14A, 14B:
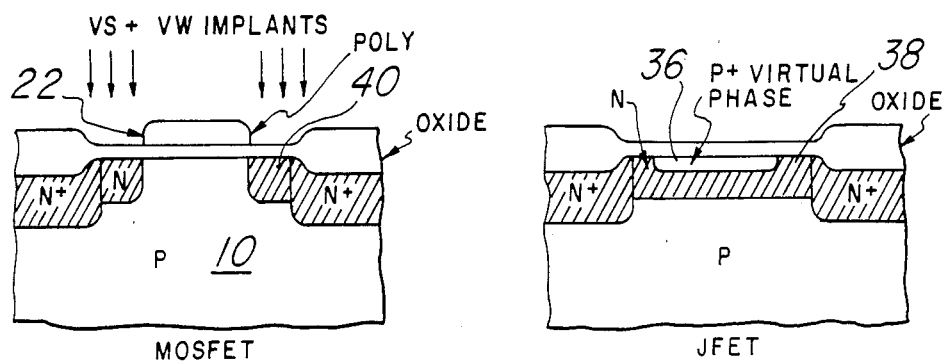
FIG. 14a shows how the combination of virtual barrier and virtual well implants creates n-type source/drain extension regions (LDD regions) 40 in the MOSFET devices in the periphery.
FIG. 14b shows how the virtual phase electrode implant also forms the gates of JFET devices in the periphery

Next, a high-dose low-energy boron implant (which also is blanket in the array, but selectively masked in the periphery) is used to form the virtual phase electrode. This step also forms the gates of JFETs in the periphery. This implant may be, for example, 6E12 per square centimeter of boron at 35 keV. As shown in FIG. 14b, the virtual phase implant creates the JFET gate 36. The JFET channel region 38 is created by the virtual well and virtual barrier implants.

In the MOSFET devices in the periphery, as shown in FIG. 14a, the combination of virtual barrier and virtual well implants creates n-type source/drain extension regions (LDD regions) 40.

One advantage of the process of the present invention is that it creates both surface channel MOSFETs and buried channel MOSFETs. (The surface channel MOSFETs are enhancement-mode devices, and the buried channel MOSFETs are depletion-mode devices.) To create the buried channel MOSFETs, the moat region in the periphery is exposed to the buried channel implant (a light-dose phosphorus implant, which is performed before the poly gate level is patterned.) The use of buried channel devices has circuit advantages, as will be discussed below. To create the surface channel MOSFETs, the moat regions in the desired surface channel device locations are blocked from the buried channel implant. Other implanting steps may also be used to adjust the threshold voltages of the active devices, as is customary in NMOS (or CMOS) processing.

Figure 15:
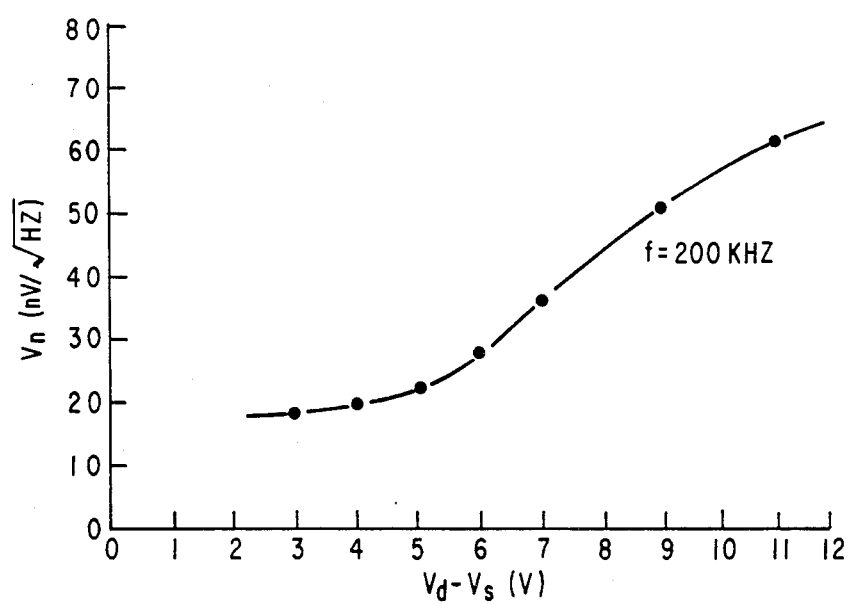
FIG. 15 shows a plot of noise spectral density at 200 kilohertz vs. drain voltage.

Buried-channel MOSFETs give good low-noise performance, but only as long as their drain voltage is kept sufficiently low. A plot of noise spectral density at 200 kilohertz vs. drain voltage can be seen in FIG. 15.

When a buried-channel device is biased above saturation, hot electrons are believed to be generated in the channel, and will produce additional electron-hole pairs through impact ionization. In a buried-channel transistor, some of the generated holes will be confined in the potential well between the bulk channel and the silicon-silicon dioxide interface. The holes must then travel along the interface from the drain region to the vicinity of the source and finally to the substrate or along the side of the gate to the channel stops. If enough holes accumulate at the interface, the threshold voltage of the transistor will shift, and a drain current increase will be observed. This phenomenon becomes more acute as transistor gate width is increased, and it is also exacerbated by the potential barriers for holes which sometimes exist at the edge of the buried channel next to the thick field oxide region.

To avoid this noise problem of buried-channel devices, while retaining the good low-noise small-signal characteristics of such devices, the present invention teaches combination of surface-channel MOS transistors with buried-channel MOS transistors in CCD peripherals. The surface-channel transistor can be correctly biased for high output current levels by the levels provided from preceding low-noise buried-channel stages, using a common drain supply voltage (VDD) for both surface-channel and buried-channel devices. That is, the surface-channel MOS output stage permits the use of low-noise buried channel devices in the small-signal stages, but avoids the necessity of biasing the buried-channel transistors into their high-noise regime for driving the output stage. The combination of the buried-channel and surface-channel transistors thus offers lower drain bias requirements, lower power consumption, lower output DC voltage, and, most importantly, superior noise performance.

With the processing parameters used in the presently preferred embodiment discussed here, the surface channel devices will have a threshold voltage in the range of 0 to 0.5 volts. The drain voltage (VDD) supply is preferably in the neighborhood of 12 volts, and the surface channel output device is biased to a gate voltage in the neighborhood of 8 volts. Since the DC output voltage is about 5 volts (this is determined by the dimensions of the load transistor), the voltage from gate to source is in the neighborhood of 3 volts. The buried channel devices will have threshold voltages in the range of $-6$ to $-7$ volts, again at about 12 volts VDD supply, and the gate to source voltage is in the neighborhood of $-3$ volts (i.e. the gate is biased about 3 volts into the on regime).

Figure 10:
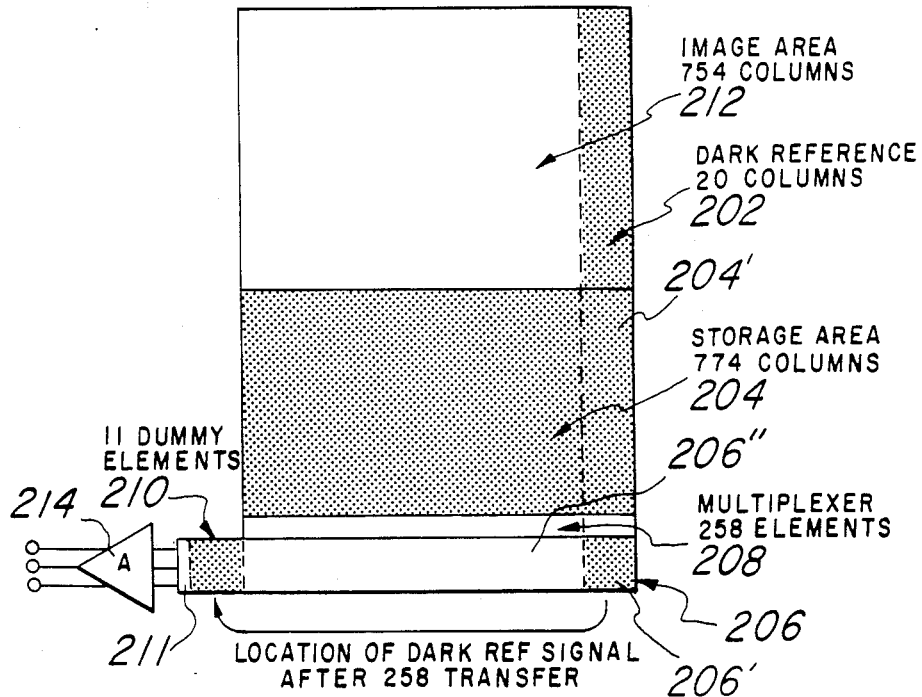
FIG. 10 show the relative locations of serial shift registers 206, multiplexer 208, and dummy elements 210 (in which the dark reference signal generated at the right edge of the image sensing area is stored during horizontal blanking interval), together with the image area 212.
Figure 13:
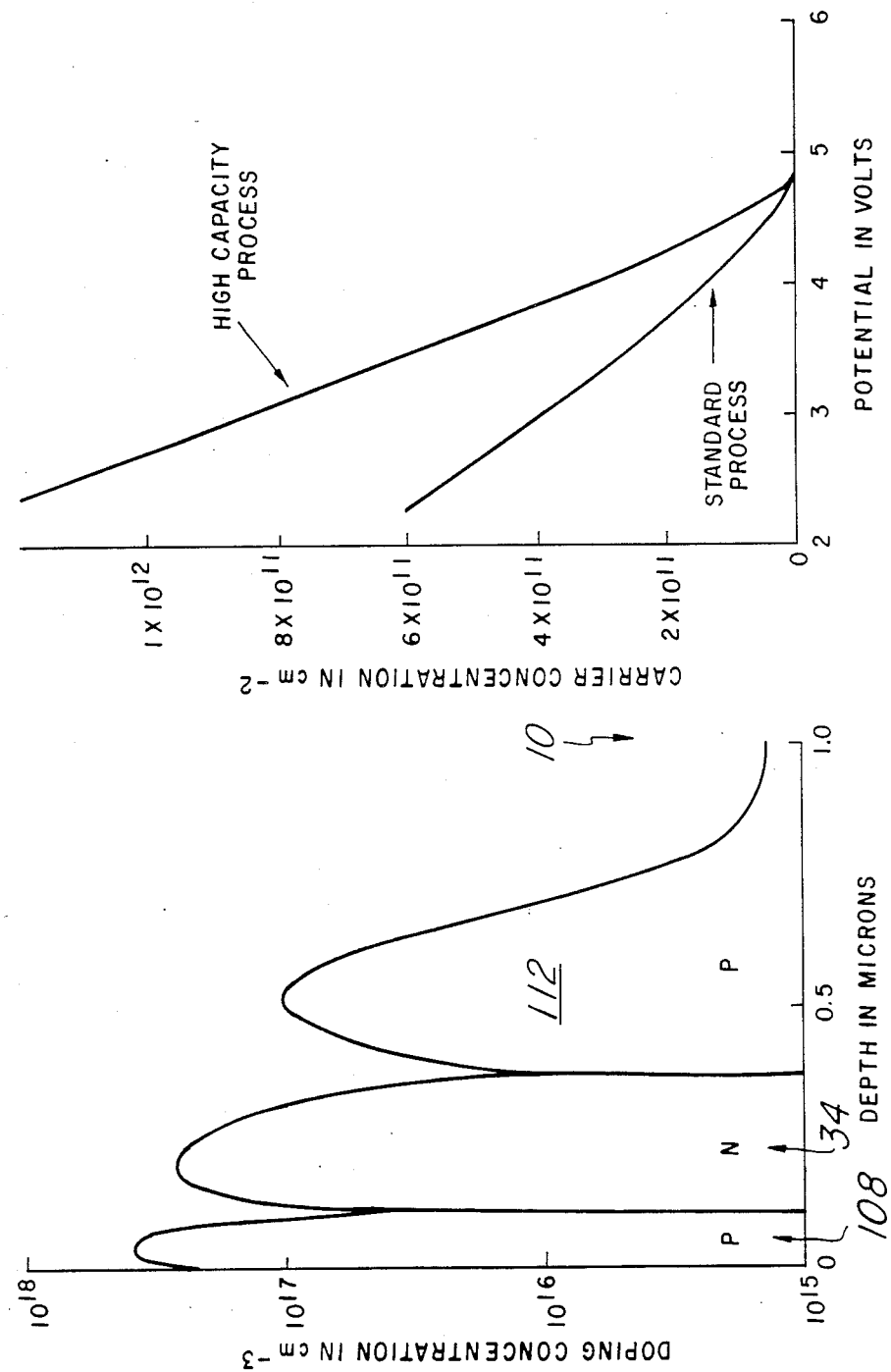
FIG. 13 shows doping profiles and the corresponding charge-potential curve for a new high-well-capacity CCD process using deep p-type regions 112 as shown in FIG. 6. A charge-potential curve for a standard process is shown for a comparison.

Processing continues with other conventional NMOS processing steps used for fabrication of the periphery, including metal patterning, contact patterning, and (if needed) second poly. Of course, an opaque protective overcoat cannot be used over the imaging array area; instead of the usual compressive nitride protective overcoat, an oxide overcoat is preferably used. The metal level, in addition to its interconnect functions, is preferably patterned to cover the dark reference area 202 and storage area 204, and may optionally (if not needed for interconnect) also be used to cover serial shift registers 206, multiplexer 208, and dummy elements 210. (The relative locations of these elements, together with image area 212, are shown in FIG. 10.)

FIG. 6 shows plan and section views of CCD cells in the image area 212 (the top portion of the figure) and storage area 204 (the bottom portion of the figure). In the image area 212, the poly level 22 is used not only to form the gates of the cells but also to form antiblooming gates 22 prime. During the virtual phase, i.e. when all the signal charge should be in virtual well locations if it is not overflowing due to blooming, the antiblooming gate can be briefly clocked negative to charge up interface states beneath its oxide with holes (accumulated from the virtual electrode and from the substrate). The antiblooming gate can then be clocked positive to collect stray electrons, which recombine with the holes stored in the interface states. Antiblooming operation is discussed in much greater detail in Hynecek, 30 IEEE Transactions on Electron Devices page 941 (1983), which is hereby incorporated by reference.

The process discussed has created channel regions 13, which are separated by channel stops 21 outside of the poly gate locations 22, and by the background doping of the substrate 10 underneath the poly gates 22. Underneath each poly gate 22 is a clocked barrier 116 and a clocked well 30. The clocked well 30, created by a patterned arsenic implant as discussed above, creates a localized space charge from the ionized implanted arsenic atoms. (In the diagram of FIG. 6, all implants are shown by their net space charges, i.e., p-type implants are shown as negative charges and n-type implants are shown as positive charges.) Underneath the virtual phase electrode 108 (which is created by a blanket boron implant, as discussed above) are virtual barrier portions 118 and virtual well portions 34 (as mentioned above, the virtual well portions 34 are preferably created by a patterned phosphorus implant, and a blanket phosphorus implant is preferably used to create the virtual barrier 13.) (Note that, in the image area 212, the antiblooming gate 22 prime separates the virtual barrier region 118 from the virtual well region 34.) A deep blanket p-type implant 112 is also preferably used under the virtual well implant, to enhance its capacitance. Since this implant is preferably performed as a blanket implant, it also increases the concentration of the p-type substrate directly underneath the virtual barrier regions.

The CCD array organization which makes use of the processing steps and device structures discussed above will now be described.

Output Structures

Figure 8:
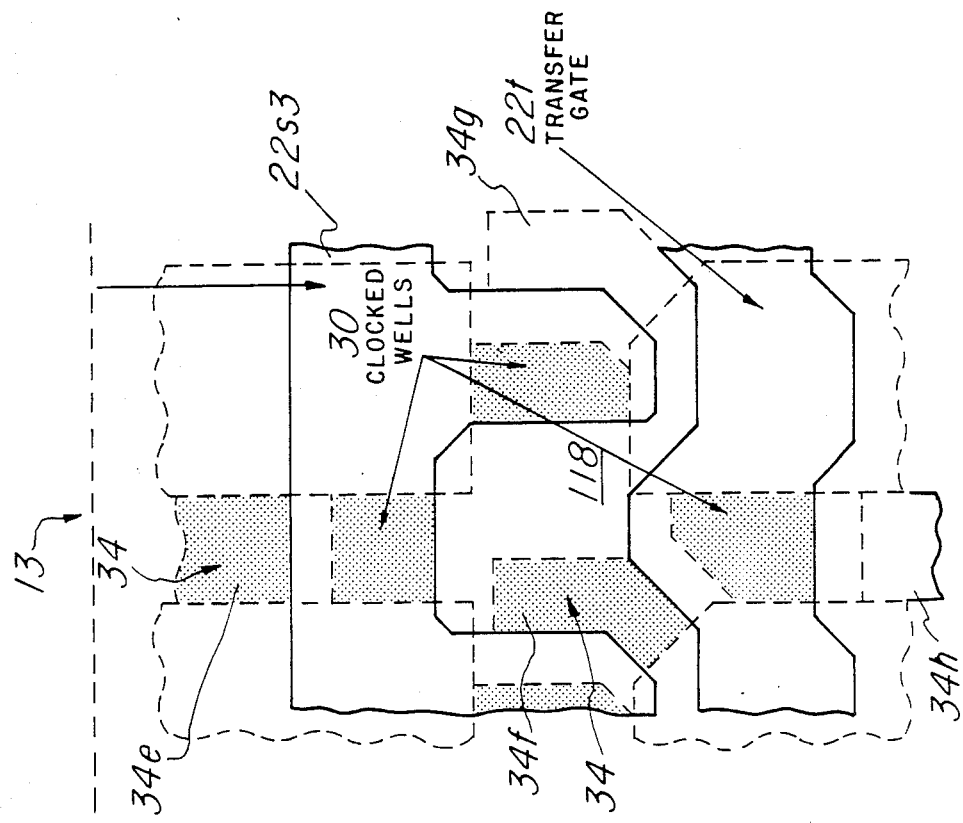
FIGS. 7 and 8 show how the vertical columns of CCD elements (like those shown in FIG. 6) which extend through the image area 212 and storage area 204 are connected at the bottom end of the two arrays.
Figure 7:
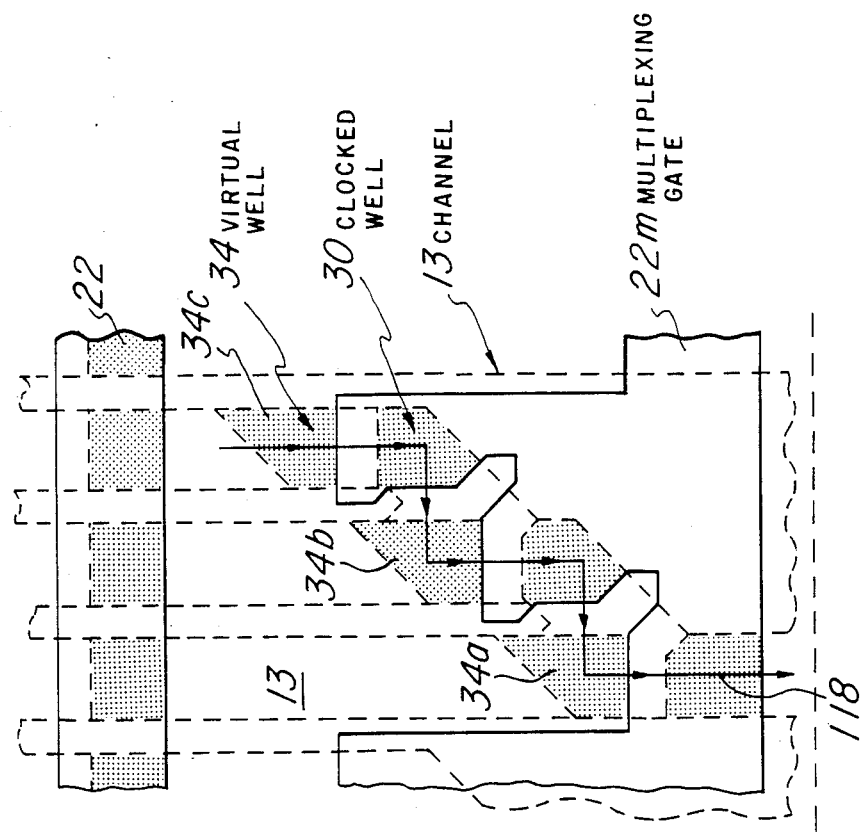

Thus, vertical columns of CCD elements as shown in FIG. 6 extend through the image area 212 and storage area 204. At the bottom end of the two arrays, these columns of CCD elements are connected as shown in FIGS. 7 and 8. The gate 22 shown is the last gate in a series of gates such as that shown in the bottom of FIG. 6. Thus, when one line is being transferred from the storage area 204 into the serial shift registers 206, this gate is clocked to transfer charge packets from the three channels shown into the virtual wells 34 between it and the multiplexing gate 22M. The multiplexing gate 22M is then clocked to transfer charge from virtual well 34a to virtual well 34e at the top of FIG. 8. The same clocking operation transfer charge from well 34b to well 34a, and from well 34c to 34b.

FIG. 8 shows one serial shift gate 22s3 and one parallel transfer gate 22t. As will be seen from the shown configuration of clocked wells 30 and virtual wells 34, when the serial transfer electrode 22s3 is clocked it will not only transfer charge from virtual well 34e to virtual well 34f, it will also transfer charge from well 34g to well 34f. That is, this gate 22s3, which is the gate of the serial shift register, performs both serial clocking and parallel transfer. The transfer gate 22t will transfer charge in parallel from well 34f (and all the wells corresponding to it) to another row of wells 34h. These wells 34h are adjacent to another serial transfer gate 22s2, not shown; the wells 34h are positioned with respect to serial transfer gate 22s2 approximately as wells 34e are positioned with respect to transfer gate 22s3.

Note that, as charge is being clocked along the serial transfer gate 22s3, it sees a virtual barrier 118 which is wider than the virtual well 34. As may be seen from comparison with FIG. 6, this is not the same as the relative sizing used in the CCD array. These wider barrier assist in achieving good timing and charge transfer efficiency in both of the two possible directions of charge transfer (serial and parallel).

Three transfer gates like 22s3 are preferably used, to separate the three colors of the imager. (To correspond to this separation, color filter stripes are preferably overlaid on the individual channels of image area 212, so that, for example, well 34a has collected information from a red pixel site, well 34b has now collected information from a green pixel site, and well 34c has collected information from a blue pixel site.)

Thus, at the bottom of the storage array there will typically be a multiplexing gate, a first serial shift register gate 22s3, a first parallel transfer gate 22t, a second serial shift register gate 22s3, a second parallel transfer gate 22t, a third serial shift register gate 22s3, and a third parallel transfer gate 22t. Of course, more or less than three colors may be used: four colors could be implemented by using four color stripes over the imaging area, and a fourth serial register 22s4 together with a fourth amplifier.

The third parallel transfer gate 22t is an optional feature, which can be used to shift charge out of the third serial shift register 22s1 into an n+ drain diffusion (not shown). This n+ drain diffusion can be used to clear stray charge out of the whole array at power-up, without the delay of clocking charge serially through the output amplifier. Another n+ drain diffusion (not shown) is preferably located next to the first CCD element in each column at the top of the array; these two drain diffusions both serve to collect stray charge (photocarriers) which might otherwise diffuse into the array to cause high noise in pixels near the edge. A further related feature is two guard columns at the edge of the array: these columns have their wells and barriers patterned oppositely to the other adjoining columns, so that when the array lines are clocked these columns do not transfer charge down to the registers 22s3 etc, but instead transfer their charge into the top n+ drain. This prevents diffusing carriers from causing a spike in dark current at the first and last pixels of each line, which would cause difficulties in subsequent signal processing.

Thus, after serial clocking has emptied the shift registers 206 (i.e., the wells 34e through 34h are all essentially empty), the lines 22 in the storage area 204 are all clocked, so that one line of charge is transferred into the wells 34a, 34b, and 34c above the multiplexing gate 22M. The multiplexing gate 22M is clocked once, to transfer charge from well 34a to well 34e, and serial electrode 22s3 is then clocked to transfer that same charge packet to well 34f. Next, the multiplexing gate 22M is clocked again to transfer the charge packet which was previously in well 34b and is now in well 34a, into well 34e, while transfer gate 22t is clocked at the same time, to transfer the charge which was originally in well 34a into well 34h. By repetition of this operation, the shift register gates 22s3, 22s2, and 22s1 (not shown) are loaded with the charge packets corresponding to the separated colors from the line of information which was just transferred out. The serial transfer gates 22s3, 22s2, and 22s1 are now clocked (while the parallel transfer gates 22t are not clocked) to transfer these charges out through the output amplifiers 214.

Preferably the serial transfer gates 22s3, 22s2, and 22s1 of shift registers 206 are clocked using phases phi-rs, phi-cl, and phi-sh as shown in FIG. 4b. These same clock phases are also used, in the preferred embodiment, in the output amplifiers 214, as will now be discussed.

Figure 4A:
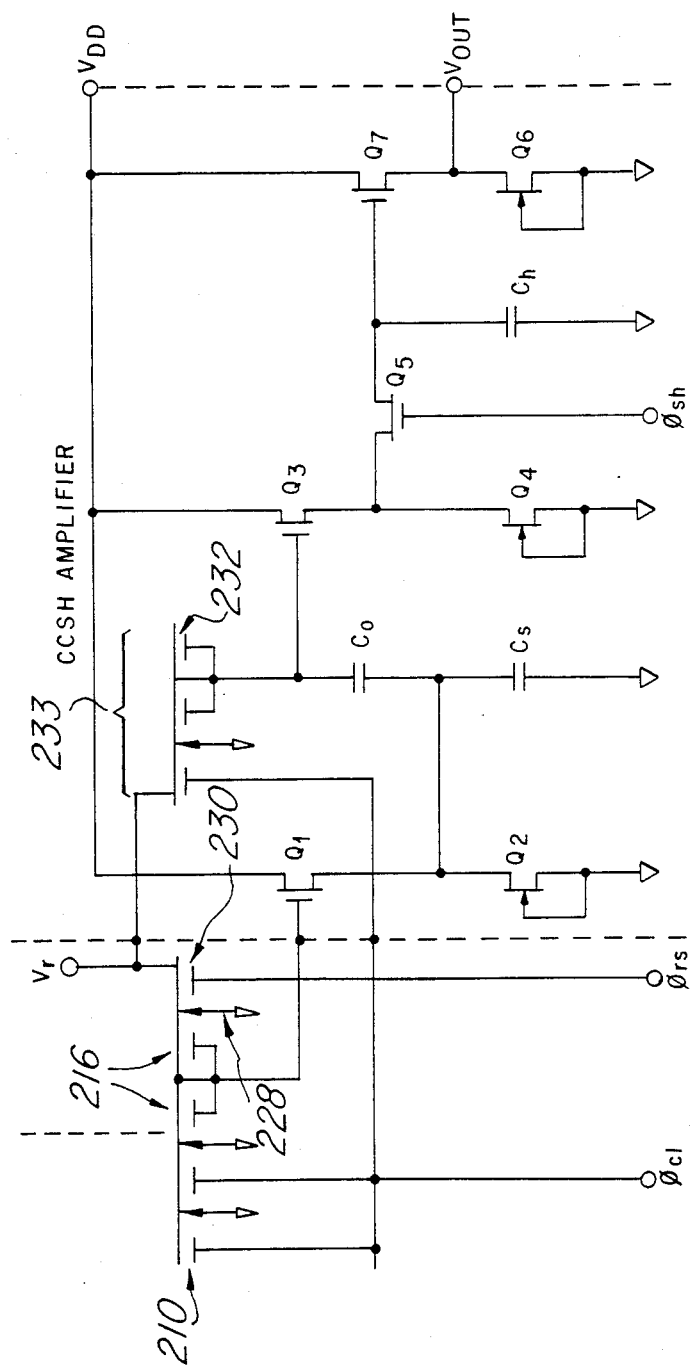
FIG. 4a shows the correlated clamp sample and hold amplifier of the presently preferred embodiment.

FIG. 4a shows the correlated clamp sample and hold amplifier of the presently preferred embodiment.

Note that the ends of the second serial shift register 206 include dummy elements 210. These dummy elements 210 are gated by the serial transfer gates 22s3, 22s2, and 22s1, but the parallel transfer gates 22t need not be included in this portion of the shift registers 206. Each of these shift registers ends in a detection node, as shown on FIG. 4a.

Figure 9:
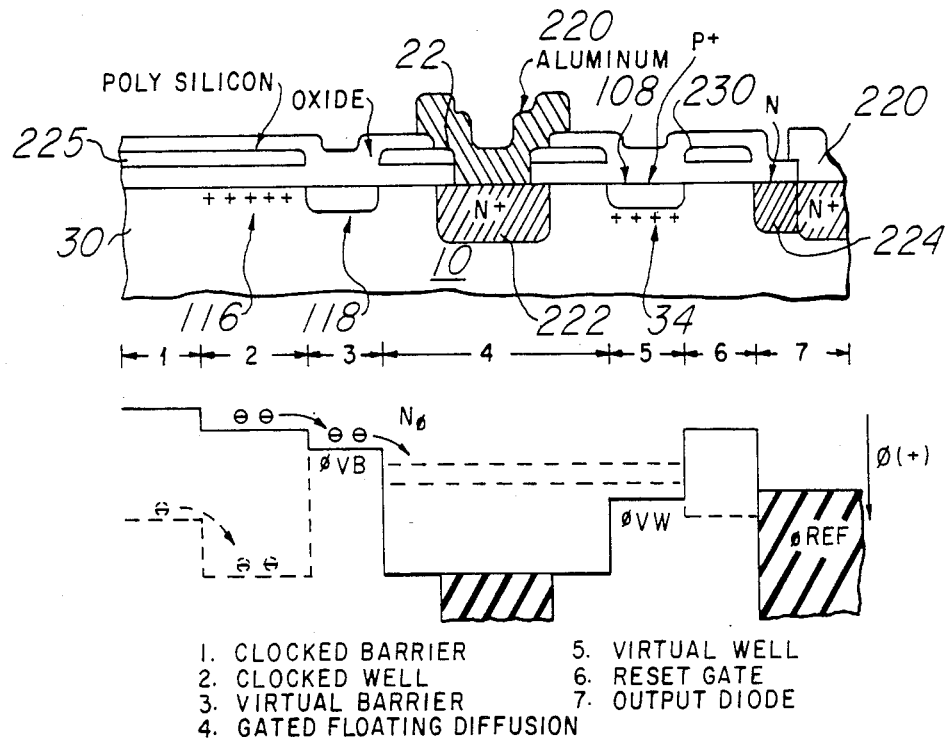

A cross section of a sample structure for this detection node 216 is shown in FIG. 9. The clocked barrier 30 and clocked well 116 are at the end of serial shift register gate 22s1 (or 22s2 or 22s3). By clocking the poly gate 22s1, charge is transferred from clocked well 116 over virtual barrier 118 into the capacitor defined by diffusion 222 and the portion of poly plate 22 and aluminum contact 220 which are tied to it. This node has a reasonably linear charge-voltage relationship, corresponding to a very small capacitance. That is, in this node the gate is shorted to the channel, so that only a small channel-to-substrate capacitance remains for the charge storage. The function of this detection node can also be considered in another way: due to its small capacitance it is an efficient quasi-Fermi-level detector for the charge which is almost entirely stored in virtual well 34.

The n+ diffusion 222 is formed by the source/drain implant: the lightly doped drain extension regions, such as region 224 shown in FIG. 9, are preferably provided by exposure to both the virtual well and virtual barrier implants. Thus, in peripheral NMOS transistors, lightly doped drain extensions 224 are self-aligned to the gate, and the source/drain n+ diffusions 222 need not be.

The diagram of FIG. 4 schematically shows each CCD element as an MOS gate (the clocked gate) followed by a grounded JFET gate (the virtual phase gate). Note that the reset voltage V-r is also connected to detection node 216 through a CCD structure: the clock phase phi-rs is clocked to transfer charge through a virtual phase node 228 to the detection node 216. The reset gate 230 and/or the virtual phase gate 228 are preferably configured to introduce a certain resistance at this point. This can be done by narrowing the patterned channel in this region, or by lengthening the LDD region 224, to introduce more series resistance.

Thus, initially the detection node 216 is reset to approximately a reset voltage V-r. Detection node 1 is also connected to gate a source follower stage including transistors Q1 and Q2.

Q1 is preferably a buried channel MOSFET having width of 9 microns and length of 6 microns. Q2 is preferably a JFET having a channel length of 30 microns and a gate width of 6 microns. The very low W/L ratio of this first stage load is used because this device is a high-pinchoff device, i.e. its pinchoff voltage would be in the neighborhood of 4 volts; use of a high-pinchoff JFET here reduces the JFET's noise contribution, but its length has to be greater than its width to keep its current low.) The output of this first source follower stage is connected to the node between capacitor C-o and C-s. The channel length can be varied within the range of 3 to 100 microns, or even wider if appropriate process modifications are used, as is well known to those skilled in the art.

Capacitor C-s has the effect of low-pass filtering of the output of the source follower stage which includes Q1: as is well known, less amplifier bandwidth means lower total noise power.

After the reset phase, the clamp phase clock phi-cl is clocked, and, on the falling edge of this clock, a signal charge packet is transferred from CCD register into first detection node 216. This phase is also connected to gate a short CCD channel which provides a dummy element, namely second detection node 232.

The second detection node 232 has essentially the same construction as the first detection node 216, but has slightly larger dimensions. That is, the detection node 232 includes an n+ diffusion 222 which is shorted to a poly capacitor plate, and is separated from the reset voltage supply V-r by a CCD element (both clocked phase and virtual phase, i.e. both MOS and JFET active elements).

Thus, during clock phase phi-clamp (phi-cl), the gate of transistor Q3 will see a voltage corresponding to the reset voltage on second detection node 232, but this reset voltage will include less noise than the reset voltage generated on first detection node 216, since second detection node 232 is not only larger but also is connected to large capacitor C-o, so that the kT/C noise component is reduced. On the falling edge of the phi-clamp, capacitor C-o will pass the output of Q1 through to the gate of Q3, except that the noise component of Q1's output will be partially damped and added to the low-noise reset voltage level already present on Q3's gate (damping is accomplished by the shunt path to ground provided by C-s, which provides low-pass filtering of the signal provided to Q3).

The second buffer amplifier preferably includes the buried channel MOSFET Q3 which is 30 microns wide and 6 microns long, together with a JFET current source Q4 which has 20 microns channel width and 12 microns gate length. On clock pulse phi-sh, the output voltage of the second source follower stage is sampled by transistor Q5 and held on large capacitor C-h to drive the final source follower stage including transistors Q6 and Q7.

Note that JFET load Q4 is not a high-pinchoff device like Q2, but instead is a low-pinchoff device, with a pinchoff voltage in the neighborhood of 2 volts.

An advantage of the process of the present invention is that it does provide two kinds of JFETs, and, as the foregoing example shows, this is advantageous to circuit designers: long high-pinchoff devices can be used for loads where special low-noise performance is required, and low-pinchoff devices can be used elsewhere.

This is controlled by the masking of the virtual well and virtual barrier implants: the high pinchoff devices are exposed to the virtual well implant, and the low-pinchoff devices are exposed to the virtual barrier implant.

Transistor Q7 is preferably a surface channel MOSFET, not a buried channel device like transistors Q3 and Q1, and has a width of 200 microns and a length of 6 microns. Transistor Q6 is another JFET load, and preferably has channel width of 120 microns and gate length of 12 microns. Of course, the specific device dimensions given here may be widely varied, and are provided simply to illustrate as clearly as possible the best mode of the invention as presently contemplated.

The optimization of amplifier structures of this type for low-noise operation will now be discussed in detail.

Amplifier noise optimization

A further teaching of the present invention is that this general amplifier configuration can be optimized for a given clock frequency and for a given detection node capacitance, to optimize the noise performance. Thus, for NTSC rates and for C-d in the approximate neighborhood of 0.02 pF, C-o should be about 45 times the capacitance C-d of the first detection node 216, C-s should be about 44 times C-d, and the ratio x of the source-drain capacitance of transistor Q1 to C-d should be about 1.3; but for other rates these optimal ratios will change. Even for NTSC rates, these three parameters can be varied to provide low-noise performance which is almost as good as that at the optimum values. For example, if x is only 0.6, a figure of merit greater than two can still be obtained by making C-s 80 times C-d and C-o 74 times C-d; or if x is as large as 2.9, a figure of merit greater than two can still be obtained by making C-s 24 times C-d and C-o 27 times C-d. The optimal parameter values give a figure of merit greater than 2.15, but no prior art peripherals give a figure of merit greater than one. The optimization of these parameters, for a given set of operating constraints, will now be discussed in detail.

The reset noise of a simple capacitor will first be discussed, as framework for discussion of the more complex circuits which are used in practice. The notation used here will normally write subscripted variables on line, will represent exponentiation by double asterisks, and will write omega (angular frequency) as w. Thus, (qn)**2 would be read as "q-sub-n squared." Greek letters mu (for electron mobility) and pi are written out.

The conventional treatment of reset noise on a capacitor is based on the theory outlined by Pierce, and is derived from the fundamental assumptions of statistical thermodynamics. See J. R. Pierce, "Physical Sources of Noise," Proc. IRE, vol. 44, pp. 601–608, May 1956, which is hereby incorporated by reference. To review the line of reasoning that is used to calculate the noise on a capacitor which is periodically reset and to establish definition of terms, two slightly different circuits, shown in FIG. 1 and in FIG. 2, will be considered. In FIG. 1 a resistor Rr provides coupling between the capacitor Cd and a charge reservoir at a potential Vo. The voltage on the capacitor can be periodically sampled by an ideal voltmeter and the readings can be statistically evaluated. The charge qn, which can be considered a canonical variable of the system, can be calculated from the following equation:

$$qn(t) = Cdvn(t) \qquad (1)$$

In equation (1) the DC quantities were subtracted and only the small signal variations are considered. The mean square value of charge taken over an ensemble of identical circuits is found from the theorem of statistical thermodynamic which states that every degree of freedom represented by a canonical variable of the system has an associated energy of $(\frac{1}{2})kT$ in the system Hamiltonian. This can be written as follows $$(\tfrac{1}{2})kT = (\tfrac{1}{2}) <qn^{**}2>/Cd \qquad (2)$$

The sharp brackets ($<>$) indicate an ensemble average, and qn indicates the charge fluctuation on the capacitor, hence noise. The RMS value of the noise qn can be then written as follows:

$$qn = (kTCd)^{**}(\tfrac{1}{2}) \qquad (3)$$

which is a well known result. The same expression is usually derived by considering the random process to be ergodic, which means that the ensemble averages can be replaced by the time averages and the Fourier transform can be used to carry out calculations in a frequency domain. The charge noise can be obtained from the following integral:

$$<qn^{}2> = (Cd)^{}2 \text{ times the integral of} \\ ((vn(f))^{**}2)df \qquad (4)$$

where vn(f) is the noise spectral density, in this case a band limited white "Johnson" noise $vn^{**}2(f) = 4kTRr$. Appendix A shows details of the calculation for the circuit given in FIG. 1.

Figure 2:
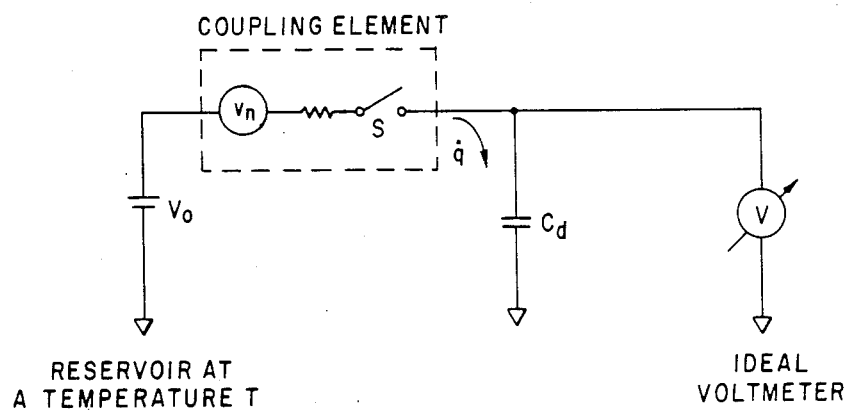
FIG. 2 shows a thermodynamical system in equilibrium with a more complex coupling element.

A more realistic model, however, is the circuit illustrated in FIG. 2 which more closely represents the operation of an actual charge detection node in a CCD image sensor. To calculate the noise using equation (4) for this case is more difficult, since the noise spectral density is not known prior to having detailed information about the frequency and duty cycle of the switching process. The result, however, must be the same as for the circuit in FIG. 1 following the same general thermodynamical principle.

Important conclusions obtained from the above review are that the circuit in FIG. 1 can be used to calculate the RMS value of noise on the capacitor in the circuit shown in FIG. 2 and that the noise is not dependent on the value of resistor Rr. The next section will show that the second conclusion may not be true in more complex circuits exhibiting a capacitive feedback usually encountered in charge detection amplifiers.

The reset noise of more complex circuits will now be discussed.

Actual charge detection amplifiers in CCD image sensors usually consist of a capacitor connected to the gate of a MOS source follower. This configuration possesses a positive feedback from the source to the gate of the MOS transistor due to the finite source-gate capacitance. To analyze the reset noise of this configuration, an idealized case shown in FIG. 3 will be considered first. Amplifiers A1 and A2 will be noiseless and the gain of the amplifier A2 will be set to unity. To make the model more realistic the frequency response will be limited by the low-pass filter RsCs, and the noise generated by the resistor Rs will be included. This circuit is known to exhibit a low input capacitance that results from the positive feedback, which is a useful feature in applications where inherently large parasitic capacitances are coupled to the detection node. A good example of such applications is a MOS X-Y addressed array, or a line addressed array (9).

Figure 3:
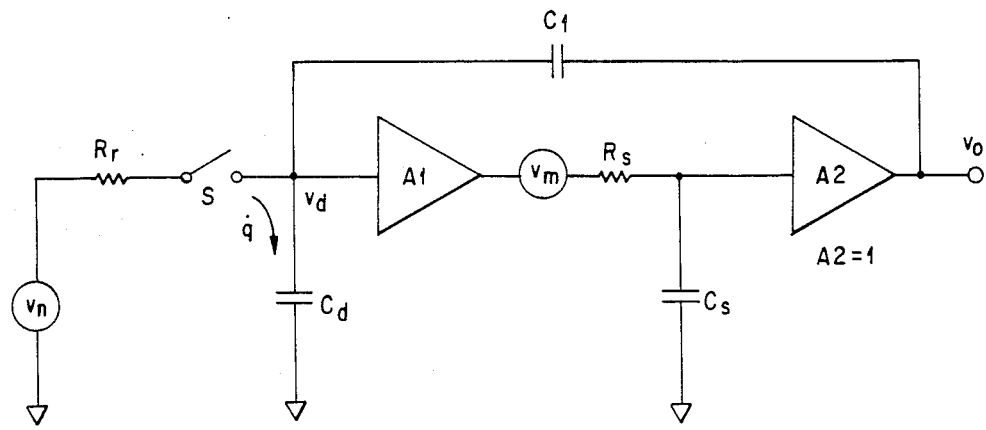
FIG. 3 shows an idealized circuit diagram of a charge detection amplifier with a positive capacitive feedback.

To calculate the reset noise on the capacitor Cd in FIG. 3, a procedure similar to that used for the previous simple case will be followed. After substitution of appropriate circuit expressions into equation (4), the result will be $$<qn^{}2> = kT((Cd + Cf(1-A1))^{}2 + Cf^{**}2Rs/Rr + \qquad (5)$$
$$(Cd + Cf)RsCs/Rr)/(Cd + Cf(1-A1) + RsCs/Rr)$$

The details of the derivation are given in Appendix B. The contribution to noise from the resistor Rs can be made small and will be neglected in subsequent considerations. The rigorous treatment of this problem can be obtained following the general outline presented in A. Papoulis, Probability, Random Variables, and Stochastic Processes (New York: McGraw-Hill 1965) pp. 430-452, which is hereby incorporated by reference. The important feature to note in the obtained result is that the noise as described by equation (5) depends now on the value of the reset resistor Rr. Two modes of operation can be clearly identified: a soft reset mode for $$(Cd + Cf(1-A1))Rr >> RsCs \qquad (6)$$

and a hard reset mode with the inequality sign in equation (6) reversed. There are also two values of noise associated with each mode: a soft reset noise expressed by equation (7) and a hard reset noise expressed by equation (8).

$$<qn^{**}2> = kT(Cd + Cf(1-A1)) \qquad (7)$$

$$<qn^{**}2> = kT(Cd + Cf) \qquad (8)$$

The soft reset noise mode is desirable in device applications, since its value is lower and adjustable by the gain of the amplifier. To operate in this mode, the value of the reset resistor Rr must be carefully selected to satisfy the condition given in equation (6).

Figure 5:
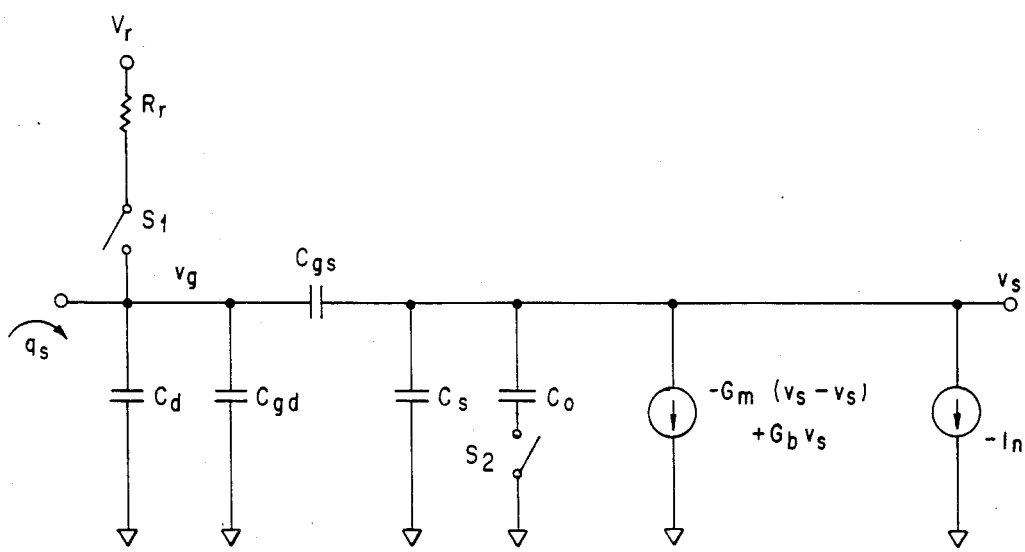
FIG. 5 shows a small signal equivalent circuit diagram for the first stage of the charge detection amplifier.

The described formalism can now be applied to the actual circuit with its equivalent small signal diagram shown in FIG. 5. Calculations are similar to the calculations for the previous case and will not be repeated again. The condition for the soft reset is $$(Cd + Cgd + Cgs(1-A1))Rr >> (Cgs + Cs)/(Gm + Gb) \qquad (9)$$

where Gb is the back-gated transconductance of the device, and the corresponding soft reset noise is $$<qn^{**}2> = kT(Cd + Cgd + Cgs(1-A1)) \qquad (10)$$

The correct value for the reset resistor Rr must be once again carefully selected to satisfy equation (9). A large value of Rr, however, will cause an incomplete reset which could lead to saturation and overflow of the detection node. A small degree of incomplete reset on the other hand can be tolerated, since the following clamping process will correct the error by removing it from the signal. The soft reset mode will be used in the following amplifier design to achieve the optimum signal to noise performance.

The implications of these noise calculations for optimal design of a correlated-clamp-sample-and-hold charge detection amplifier will now be discussed.

In the circuit of FIG. 4a, the parameters that will be optimized are the size of the transistor Q1 and the values for the capacitors Cs and Co. It will be assumed that the input capacitance of Q3 and capacitance of detection node 2 can be neglected relative to Co and Cs. Furthermore it will be assumed that the on-resistance of the reset transistor in the detection node 2 is small in comparison to the output resistance of Q1. Finally, it will be assumed that the sampling noise on the holding capacitor Ch can be treated independently from the rest of the circuit and that the transistors Q3 and Q7 are large enough in order not to contribute significantly to the overall noise of the amplifier. With these assumptions in mind it is sufficient to focus attention only on the first stage of the amplifier and derive a small signal equivalent circuit diagram that will be used for further analysis. The diagram is shown in FIG. 5. To simplify expressions that must be derived to find a formula for the signal to noise ratio, it is convenient to introduce the following abbreviations:

$$Cgs = Cd/x$$

$$Cgd = Cdm/x$$

$$A1 = Gm/(Gm + Gb)$$

$$Ci = Cd + Cgd + Cgs(1 - A1)$$

$$ws = (Ci/(A1) - (to))(Cgs + Cgd)/((Cd + Cgd)(Cs + Cgs) + CsCgs)$$

$$wc = ws(Cs/Cs + Co)$$

$$to = L^{**}2/((mu)(Vgs - Vt))$$

$$ao = (am) + (af)(A1)(Vgs - Vt)/Vp.$$

The detection node capacitance Cd comprises all the fixed capacitances connected to the floating diffusion which do not depend on the gate width of Q1. The value of Cd will determine the final efficiency of charge conversion for the amplifier and can be used as a normalizing factor for Co and Cs. The model for the MOS transistor Q1 that will be used in the analysis will be as simple as possible, as set forth in equation (11), to avoid cluttered expressions that obscure the basic physics of the optimization process. It is not difficult to introduce more accurate models into the computer aided analysis in a later stage and to derive a more precise result to be actually used during the final device layout.

$$I = u(Cgs + Cgd)(Vgs - Vt)2/(2L2) \quad (11)$$

$$Gm = (Cgs + Cgd)/to \quad (12)$$

The parameter to will be used as a normalizing factor for time. The noise generated in MOS and JFET transistors will be modeled as follows (12):

$$(Im)^{**}2 = (am)4kT(Gm + Gb) \quad (13)$$

$$(If)^{**}2 = (af)4kT2(Io)/(VpO) \quad (14)$$

(Io) is the saturation current of the JFET load and it is set equal to I in equation (11). The two noise sources can be considered uncorrelated and summed into a single source (in) shown on the diagram in FIG. 5.

$$(in)^{**}2 = (ao)4kT(Gm + Gb) \quad (15)$$

Other noise contributions usually encountered in solid state devices can be considered small for simplicity of calculations and are not included in the analysis. In particular the 1/f noise will represent only a small contribution since the AC coupling and the clamping operation will filter out its effects. The 1/f contributions from the second and third stages at the imager output will be also small due to the relatively large size of Q2 and Q3. Using the above abbreviations and simplifying assumptions it is now possible to derive expressions for the signal and noise at the output of the first source follower stage:

$$(vs) = (A1)(qs)/((Ci)(1 + (iw)/(ws))) \quad (16)$$

$$<(va)^{}2> = (ao)(kT/ (Ci))(Cd + Cgs + Cgd)^{}2/((Cd + Cgd)(Cgs + Cs) + CsCgs) \quad (19)$$

There are two other noise contributions that appear at the input of the second stage: first is the remainder of the reset noise that is not completely removed by the clamping operation and the second is a new contribution similar to the reset noise that is generated on the coupling capacitor Co. These two additional contributions can be expressed as follows:

$$<(vr)^{}2> = <((qn)^{}2)> \quad (18)$$

times $(((A1)/(Ci))^{}2)$ times $(EXP(-2(wc)(tc)))$ times $(1 - EXP(-(ws)(ts)))^{}2$ $$<(vc)^{**}2> = kT/(Co) +$$

$$kT((Cd) + (Cgd) + (Cgs)) \quad (19)$$

times $EXP(-2wsts)/((Cd + Cgd)(Cgs + Cs) + CsCgs)$

The signal to noise ratio can now be evaluated simply by using equation (16) converted to the time domain, and by summing all the noise contributions given by equations (17), (18), and (19):

$$(vs)^{}2/<(vn)^{}2> = \quad (20)$$

$$((A1)(qs)(1 - EXP(-(ws)(ts)))/(Ci))^{**}2$$

over $(<(va)^{}2> + <(vr)^{}2> + <(vc)^{**}2>)$

To conveniently compare the efficiency of different signal processing methods, it is useful to introduce the following efficiency factor Fn:

$$(vs)^{}2/<(vn)^{}2 = (Fn)^{}2(qs)^{}2/(kT(Cd)) \quad (21)$$

This factor will normalize the noise of a given signal processing method to the reset noise of a simple capacitor Cd and will become a dimensionless figure of merit for the method. The factor can be expressed as a function of x, Cs and Co and a few additional constants as indicated below:

$$Fn = Fn(ts/to, tc/to, ao, A1, m, x, Cs/Cd, Co/Cd) \quad (22)$$

The explicit form of Fn can be derived following the steps outlined in Appendix C. The optimization process consists of selecting the parameters representing the given application and finding the optimum value for Fn. An example that corresponds to the discussed sensor is as follows:

$ts/to = 200$ $tc/to = 180$ $ao = 1.0$ $A1 = 0.8$ $m = \frac{1}{2}$

The optimum can be best found numerically, and, for the parameters given, it occurs approximately at the following point:

$x = 1.3$, $Cs/Cd = 44$, $Co/Cd = 45$, $Fn = 2.15$

The obtained result predicts that the CCSH signal processing method should provide three times improvement in signal to noise ratio compared to the conventional method with a simple reset which typically has the value of $Fn = 0.72$.

It is often convenient to evaluate the performance of different detection schemes by expressing the noise as the number of equivalent electrons at the detection node. This number can be derived from equation (21) by setting the signal vs2 equal to the noise vn2, which leads to $$Nee = (1/Fn)(kT(Cd)/(q^{}2))^{}(\tfrac{1}{2}) \quad (23)$$

For a typical state of the art diode with capacitance $Cd = 0.02$ pf, connected to the amplifier, the number of noise electrons at room temperature will be $$Nee = 26.5 \text{ electrons} \quad (24)$$

This value, however, will be degraded by the sampling noise on the holding capacitor, which must be made reasonably small in order not to excessively limit the bandwidth of the amplifier. A practical result, that can be achieved after accounting for all the extraneous noise contributions neglected in the presented derivation and the sampling noise of holding capacitor Cn, is approximately $$Nee = 34 \text{ electrons} \quad (25)$$

This level of noise floor is acceptable in most consumer applications and represents a significant improvement from the conventional method which uses a simple detection node reset.

The more detailed calculations referred to above as appendices A and B will now be presented.

APPENDIX A: The noise on the capacitor in FIG. 1a can be obtained from the equation for charge as follows:

$$(qn)(w) = (vn)(Cd)/(1 + iw(Rr)(Cd)) \quad (A1)$$

The noise spectral density will be considered to be a "white" Johnson noise:

$$((vn)^{**}2)(f) = 4kT(Rr) \quad (A2)$$

Substituting these values into equation (4), the expression for the charge noise will be:

$$<(qn)^{}2> = ((Cd)^{}2/(4(pi))) \quad (A3)$$

times the integral from $-$ to $+$infinity of $$(4kt(Rr)/(1 + w^{}2(Rr)^{}2(Cd)^{**}2))dw$$

This integral can be evaluated using the theory of residues. A single pole exists in the upper half of complex w plane at $w1 = i/(Rr)(Cd)$.

This will yield the desired result:

$$<(qn)^{**}2> = kT(Cd) \quad (A4)$$

APPENDIX B: The circuit equations for the charge on the capacitor Cd in FIG. 3 are as follows:

$$iwqn(w) = (vn - vd)/Rr \quad (B1)$$

$$iw(vd)(Cd) = (vn - vd)/Rr + iwCf(vo - vd) \quad (B2)$$

$$(vo) = (vd)(A1)/(1 + iw(Rs)(Cs)) + (vm)/(-1 + iw(Rs)(Cs)) \quad (B3)$$

The charge can be expressed in the form:

$$(qn)(w) = \quad (B4)$$

$$(vn/Rr)(Cd + Cf(1 - A1) + iwab)/((Gr + iwa)(1 + iwb)) +$$

$$((vm)/(Rr))(Cf)/((Gr + iwa)(1 + iwb))$$

Where:

$a + Grb = Cd + Cf(1 - A1) + RsCs/Rr$ and
$ab = RsCs(Cd + Cf) \quad (B5)$

The noise spectral densities will be considered again to be "white" Johnson noises $((vn)^{}2)(f) = 4kTRr$ and $((vm)^{}2)(f) = 4kTRs$, and will be considered uncorrelated. Using the integral in equation (4), the charge noise expression will be:

$$<(qn)^{**}2> = (1/(4(pi))) \quad (B6)$$

times the integral with respect to w from $-$infinity to $+$infinity of $$(4kTGr((Cd + Cf(1 - A1))^{**}2 +$$

$$(Cf)^{}2 + (w^{}2)(a^{}2)(b^{}2)) \text{ over}$$

$$(((Gr^{}2) + (w^{}2)(a^{}2))(1 + (w^{}2)(b^{**}2)))).$$

This integral has poles at $w1 = iGr/a$ and at $w2 = i/b$. The theory of residues will yield the following result for noise:

$$<(qn)>^{}2 = kT((Cd) + (Cf)(1 - (A1)))^{}2 + \quad (B7)$$

$$(Cf^{**}2)Rs/Rr + (Cd + Cf)RsCs/Rr) \text{ over}$$

$$(Cd + Cf(1 - A1) + RsCs/Rr)$$

APPENDIX C: To derive an explicit formula for the efficiency factor Fn, it is useful to rewrite expressions for the signal and noise contributions in terms of x, m, and Cd as follows:

$$(V_s)^{**}2 \quad (C1)$$

$$= (A1(qs)/Cd)^{}2(x/(1 + m + x - A1))^{}2$$
$$\text{times } (1 - \text{EXP}(-(ws)(ts)))^{**}2$$

$$<(V_a)^{**}2> \quad (C2)$$

$$= ((ao)kT/Cd)(x/1 + m + x - A1)(1 + m + x)/$$
$$((xCs/Cd + (m + x)/(1 + m + x))$$

$$<(vr)^{**}2> \quad (C3)$$

$$= (A1^{**}2kT/Cd)(x/(1 + m + x - (A1)))$$
$$(\text{EXP}(-2(wc)(tc)))$$
$$\text{times } (1 - \text{EXP}(-(ws)(ts)))^{**}2$$

$$<(vc)^{**}2> \quad (C4)$$

$$= kT/Co + (xkT/Cd)(\text{EXP}(-2(ws)(ts)))/$$
$$(xCs/Cd + (m + x)/(1 + m + x))$$

Similar procedure can be used for the circuit characteristic frequencies, which will become:

$$ws = (1/((A1)(to)))((1+m)/(1+m+x))(1+m+x-(A1))/\text{over}(xCs/Cd+(x+m)/(1+m+x)) \quad (C5)$$

$$wc = wx(Cs\,Cs+Co) \quad (C6)$$

From these equations, it can be seen that the term (qs)**2/(kTCd) will be factored out if a signal to noise ratio is formed according to equation (20) and the expression given in equation (22) will be obtained.

These equations, together with the equations given earlier, provide an explicit expression for the quality factor Fn, which permits numerical optimization of Fn for a given node capacitance Cd and clock rate by controlling the Capacitances Co and Cs and by controlling the size of first stage transistor Q1.

Operation and Timing

The operation of an amplifier configuration such as that shown in FIG. 4a will now be discussed in detail.

The circuit configuration of FIG. 4a is controlled by three clock phases as shown in FIG. 4b. These clock pulses are shown as having zero lag, but some spacing between the pulses (shown approximately, in the dashed additions to the clock pulse curves, as a spacing delta) is allowable. That is, the falling edge of the reset pulse need not exactly coincide with the rising edge of the clamp pulse, as shown. A small delay delta is permissible, and can in fact be advantageous, since it reduces pulse feedthrough.

These phases are preferably not commonly wired in the three amplifiers. That is, one amplifier such as shown in FIG. 4a is connected to the end of each of the three serial shift registers. The shift registers themselves can be used to provide all the clocking signals for all three amplifiers, as shown in the following table. That is, the first amplifier will have its clamp phase wired to its own shift register, but will have its sample phase wired to the second shift register and its reset phase wired to the third shift register. Similarly, the second amplifier will have its clamp phase wired to the second shift register, but will have its sample phase wired to the third register and its reset phase wired to the first shift register, and the third amplifier will have its sample phase wired to the first shift register and its reset phase wired to the second shift register.

TABLE 1

| AMPLIFIER-REGISTER INTERCONNECTIONS | | | |
|---|---|---|---|
| | FUNCTION | | |
| Amplifier: | CLAMP | SAMPLE | RESET |
| amp 1 | phi-s1 | phi-s2 | phi-s3 |
| amp 2 | phi-s2 | phi-s3 | phi-s1 |
| amp 3 | phi-s3 | phi-s1 | phi-s2 |

This interconnection of the amplifiers provides economy in wiring, and also provides sequential phase in the three off-chip outputs, which is convenient for subsequent video signal processing.

One side effect of using common lines to control the serial region clocking and the clocking of the amplifier is that the serial register now sees asymmetrical timing. As is well known in the art, the optimal timing to enhance charge transfer efficiency of CCD structures is normally 50% clocking, i.e., 50% of the total time is spent in the high state and 50% in the low state. However, as may be seen from the clocking shown in FIG. 4B, the shared clocking used in the presently preferred embodiment means that at most the serial registers see clocking which is one-third on and two-thirds off. Moreover, if a slight delay is introduced between the clock phases, to reduce clock feedthrough (which is desirable for best amplifier control), the serial registers may see a timing which is closer to one-quarter on and three-quarters off.

Such asymmetrical timing would mean, with a conventional CCD structure, that the timing would have to be operated far below the maximum clocking frequency of the CCD structure, or else charge transfer efficiency would be greatly degraded.

However, the present invention preferably modifies the structure of the CCD elements in the serial registers to accomodate this asymmetrical timing. As may be seen in FIG. 8, the virtual barriers 118 are substantially wider than the virtual wells 34. This is quite different from the usual structure, where (as seen in FIG. 6, for example) the barriers are rather narrower than the wells. However, this asymmetrical structure in the serial clocking path cooperates with the asymmetrical clock timing imposed by the use of the serial register clocks to control the amplifier, since carriers can diffuse through the wide flat potential of barrier 118 during the long off portion of the clock pulse.

This asymmetrical structure achieves good charge transfer efficiency, while avoiding any need for additional implants to achieve more than two potential levels within a given clock phase.

FIGS. 18A, 18B, 18C, 19A, 19B, 19C, 20A, 20B, 20C, 21A, 21B, and 21C show the presently preferred layout of critical portions of the amplifier. These figures are overlays showing the mask layout: FIGS. 18A, 19A, 20A, and 21A show the moat 502, source/drain 504, poly 510, and the patterned channel stop 512 levels; FIGS. 18B, 19B, 20B, and 21B show the moat 502, source/drain 504, patterned channel implant 506 (which is performed before the patterned channel stop implant 512), and As-well (clocked well) 508 levels; FIGS. 18C, 19C, 20C, and 21C show the moat 502, source/drain 504, virtual well 514, virtual phase electrode (boron) 516, contacts 518, and metal 520 levels. These figures all adjoin each other; left to right, the order is FIG. 18, FIG. 19, FIG. 20, and FIG. 21.

While this particular layout is certainly not necessary to practising the present invention, it does illustrate several innovative features. These layouts, and the other mask patterns shown, are copyrighted 1985 by Texas Instruments Inc.; they contain proprietary information, and may not be used without the consent of Texas Instruments Inc.

FIG. 18 shows transistor Q1, capacitor C-o, and capacitor C-s. First detection node 216 and clock line phi-rs are not shown, nor are the serial shift registers to which these elements are connected. FIG. 19 shows the right side of capacitor C-o, as well as transistor Q2 and second detection node 232 with its reset gate 230, and transistors Q3 and Q5. FIG. 20 shows JFET load Q4, and large capacitor C-h. FIG. 21 shows surface channel output transistor Q7. Output JFET load Q6 is not shown (since it is preferably located near the contact pads, which are also not shown), but it is like Q4, only larger. Note that surface-channel MOSFET Q7 has its channel exposed to the SCHST implant, which the buried-channel devices (such as Q1) do not. Note also that both types have their gate regions exposed to the virtual well implant, to provide LDD extension regions which are self-aligned to their gates.

In addition, dummy crossovers are preferably included to balance the RC time constants of the three control lines used to control clocking of the three amplifiers. That is, the configuration of the amplifier clocking requires that the metal clock lines cross each at some points, which is accomplished by contacting one of the clock lines to a short strip of polysilicon to cross under the other metal line; in this feature of the present invention, dummy crossovers (short poly lines in series with the metal lines) are preferably wired in series in some of the clock lines to balance the additional RC delay introduced by the poly strips in others of the clock lines.

The output V-out of the third source follower stage can be used to drive an off-chip line for subsequent stages, such as an NTSC encoder. However, the most difficult and critical processing stages have now been performed on chip, and the subsequent off chip processing is greatly simplified.

Of course, substantial advantages can be obtained even if not all of these stages are integrated on chip. For example, the sample and hold stage of Q5, C-h, Q7, and Q6 could be moved off chip, so that the output of transistor Q3 would be used to drive the off chip line. This embodiment is slightly less preferable, but still derives advantage from significant innovative features of the invention. In particular, the advantages of having a reset resistance in the reset path to first detection node 216 are retained; as are the advantages derived from correct relative sizing of transistor Q1 and capacitors C-o and C-s relative to the size of the detection node 216; as are the advantages of having a dummy CCD structure 233, connected to a second detection node 232, on chip; as are the advantages of having reset gates (in a color device) cross-coupled to serial shift register gates.

It is significantly less preferable to move the entire detection node structure 233 off chip (i.e. use the output of Q1 to drive a line off chip), but even this structure still permits advantageous use of a reset resistance in the reset path to first detection node 216.

The array clocking preferably used can now be discussed with reference to FIG. 10. An image area 212 is exposed to an aerial image, and allowed to collect charge for a desired length of time. Meanwhile, the dark reference CCD elements in area 202 collect whatever charge may be contributed by dark currents. The dark reference columns in area 202 have the same configuration as those in the image area 212, except that the ones in dark reference area 202 are covered by a metal shield so that light does not reach them.

At every vertical frame transfer interval, the gate lines of both image area 212 and storage area 204 are clocked repeatedly, until the entire image has been transferred from image area 212 into storage area 204. After this, the storage area 204 is clocked one line at a time. After each line from storage area 204 is transferred through multiplexer 208 into the three shift registers 206, the shift registers 206 are clocked to transfer these charge packets through output amplifiers 214.

Note that in the foregoing operations, the dark reference columns 202 at the edge of the image area 212 have been transferred through portion 204 prime of the storage area 204 into the six or seven elements (the area 206 prime) at the end of the three shift registers 206 which is farthest from the output amps 204.

After each line of charge packets has been transferred into the serial registers 206, the shift registers are clocked to move the pixel signals along shift registers 206, through dummy elements 210, and into the charge detection node area 211. However, according to the present invention, after all of the pixel image charges from image area 212, which are now held in serial register 206 double prime, have been clocked through charge sensing nodes 211, the dark reference signals, which originated in dark reference area 202 and came into the serial shift registers in area 206 prime, are preferably not clocked through the detection nodes 211, but are left in the dummy elements 210. Thus, when the next line transfer occurs, the dark reference information is already in the dummy elements 210, and is therefore clocked through detection nodes 211 and 214 first.

The information from dark reference pixels 202 is not processed on-chip, but provides useful information for offset and noise level estimation for off-chip amplifiers. However, if the dark reference information is clocked into the leading edge of the serial registers, as in the prior art, the delay imposed by the dark reference pixels plus the dummy elements necessary to separate the amplifiers 214 from the CCD array, will be excessive. To put this in another way, the various standard TV formats all have predetermined limits on the amount of time available for horizontal blanking. By combining the delay necessary for dummy elements 210 with the delay necessary for dark reference signals 206 prime, the present invention permits the predetermined time limit to be satisfied without having to curtail the number of dummy elements 210, or attempt to use non standard clock rates in the serial shift registers 206, or curtail the time permitted for parallel transfer and multiplexing operations, or otherwise undesirably constrain the design.

Thus, the foregoing system permits CCD imagers to provide a fully NTSC-compatible (or PAL or SECAM-compatible) output timing. The vertical blanking intervals are used to transfer the entire image in parallel from image area 212 to storage area 204, and the horizontal blanking intervals are used to transfer one line of pixels in parallel from storage area 204 through multiplexer 208 into the three shift registers 206.

As will be recognized by those skilled in the art, the present patent application teaches numerous broadly applicable concepts in CCDs. These concepts may be embodied in a tremendous variety of device, processing, and system embodiments, and the scope of the present invention is accordingly not limited except as specified in the claims.

What is claimed is:

1. An imager comprising:
an image area comprising a plurality of columns of CCD elements, said image area also comprising a dark reference area comprising a further plurality of columns of CCD elements shielded from exposure to light;
a storage area, comprising a plurality of columns of CCD elements shielded from exposure to light, and further comprising:
a CCD serial shift register, comprising means for receiving packets of charge from respective ones of said columns of CCD elements in said storage area, and a coadjacent chain of dummy elements adjacent to said amplifier, each dummy element in said coadjacent chain of dummy elements being a CCD element which is not connected to receive charge packets from any column of said storage area except by transfer through respective other elements in said shift register;
and an amplifier connected to said serial register at the opposite end from the portion of said serial register which initially receives charge packets generated in said dark reference area from said storage area.

2. The imager of claim 1, wherein said shift register also comprises, in addition to said coadjacent chain of dummy elements, a plurality of elements which are connected to receive charge packets shifted from one or more columns of said storage area.

3. The imager of claim 2, comprising three of said shift registers, and further comprising a multiplexer, wherein said multiplexer is connected between said storage area and said three shift registers to selectively transfer charge packets from three adjacent ones of said columns of said storage areas into three corresponding ones of said elements of said respective three serial shift registers.

4. The imager of claim 3, further comprising color filter stripes overlaid on individual columns of said image area.

5. A method of operating a CCD imager, comprising the steps of:
(A) exposing an image area comprising a plurality of columns of CCD elements to an optical image, said image area also comprising a dark reference area comprising a further plurality of columns of CCD elements shielded from exposure to light;
(B) periodically, at predetermined vertical frame transfer intervals, transferring charge packets accumulated in said columns of CCD elements in said image area into corresponding columns of CCD elements in a storage area, said storage area comprising a plurality of columns of CCD elements shielded from exposure to light;
(C) periodically, at predetermined line transfer intervals, transferring respective charge packets simultaneously from multiple ones of said columns of CCD elements in said storage area into respective corresponding elements of a serial shift register, said serial shift register comprising a chain of CCD elements;
wherein said shift register has an output end connected to a coadjacent chain of dummy elements, each dummy element in said coadjacent chain of dummy elements being a CCD element which is not connected to receive charge packets from any column of said storage area except by transfer through respective other elements in said shift register, the output of said chain of dummy elements being connected to an amplifier;
and (D) clocking said shift register and said chain of dummy elements, in intervals between successive transfers from said storage area into said shift register, so that charge packets originating in said dark reference area of said image area are left in said dummy elements until the next transfer from said storage area into said shift register, and charge packets originating in portions of said image area other than said dark reference area are transferred into said amplifier before the next transfer from said storage area into said shift register.

6. The method of claim 5, wherein said step (C) comprises:
transferring said charge packets through a multiplexer, wherein said multiplexer is connected to every column of said storage area, and is also connected to a first said shift register to transfer a plurality of charge packets into elements of said first shift register in parallel.

7. The method of claim 6, wherein
said first shift register comprises both means for serially transferring charge packets along its own length and also means for transferring charge packets to a second shift register in parallel,
and said second shift register comprises both means for serially transferring charge packets along its own length and also means for transferring charge packets to a third shift register in parallel;
and wherein said step (C) comprises
clocking said multiplexer and said shift registers to selectively transfer charge packets
from a first set of said columns of said storage area into corresponding elements of said first shift register,
from a second set of said columns of said storage area into corresponding elements of said second shift register,
and from a third set of said columns of said storage area into corresponding elements of said third shift register.

8. The method of claim 7, wherein said imaging area further comprises first, second, and third color filter stripes overlaid generally on individual columns of said image area,
charge packets collected from under said first filter stripe generally being transferred into said first shift register, and charge packets collected from under said second filter stripe generally being transferred into said second shift register.

* * * * *